US012707684B2

(12) United States Patent
Yang et al.

(10) Patent No.: US 12,707,684 B2
(45) Date of Patent: Aug. 11, 2026

(54) THROUGH-SUBSTRATE VIA AND METHOD FOR FORMING THE SAME

(71) Applicant: Taiwan Semiconductor Manufacturing Co., Ltd., Hsinchu (TW)

(72) Inventors: Chih Hsin Yang, Zhubei City (TW); Mao-Nan Wang, Kaohsiung City (TW); Dian-Hau Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 463 days.

(21) Appl. No.: 18/498,689

(22) Filed: Oct. 31, 2023

(65) Prior Publication Data

US 2024/0405069 A1 Dec. 5, 2024

Related U.S. Application Data

(60) Provisional application No. 63/505,455, filed on Jun. 1, 2023.

(51) Int. Cl.

| | |
|---|---|
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10W 20/00*** | (2026.01) |
| ***H10W 20/20*** | (2026.01) |

(52) U.S. Cl.

CPC ......... *H10D 62/118* (2025.01); *H10D 62/116* (2025.01); *H10D 64/017* (2025.01); *H10D 84/0128* (2025.01); *H10D 84/013* (2025.01); *H10D 84/0135* (2025.01); *H10D 84/0149* (2025.01); *H10D 84/038* (2025.01); *H10W 20/023* (2026.01); *H10W 20/20* (2026.01)

(58) Field of Classification Search

CPC .. H10D 62/118; H10D 62/116; H10D 64/017; H10D 84/0128; H10D 84/013; H10D 84/0135; H10D 84/0149; H10D 84/038; H10D 62/121; H10D 84/0151; H10D 84/83; H10W 20/023; H10W 20/20

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |

(Continued)

FOREIGN PATENT DOCUMENTS

| | | | |
|---|---|---|---|
| TW | 202242971 | A | 11/2022 |
| TW | 202247477 | A | 12/2022 |
| TW | 202307968 | A | 2/2023 |

*Primary Examiner* — Mamadou L Diallo

(74) *Attorney, Agent, or Firm* — Slater Matsil, LLP

(57) ABSTRACT

A method includes forming first nanostructures over a first region of a substrate; forming second nanostructures over a second region of the substrate; forming a first gate structure around the first nanostructures; replacing the second nanostructures with isolation regions; and forming a through via extending through isolation regions and into the substrate.

20 Claims, 50 Drawing Sheets

(56) References Cited

U.S. PATENT DOCUMENTS

| | | | | |
|---|---|---|---|---|
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,456,182 | B1 | 9/2022 | Lin et al. | |
| 12,080,759 | B2 * | 9/2024 | Lin | H10D 30/6713 |
| 2020/0295014 | A1 | 9/2020 | Yu et al. | |
| 2021/0193534 | A1 | 6/2021 | Chen et al. | |
| 2022/0223524 | A1 | 7/2022 | Choi et al. | |
| 2022/0271139 | A1 | 8/2022 | Su et al. | |
| 2022/0359652 | A1 * | 11/2022 | Lin | H10D 62/118 |
| 2023/0042196 | A1 | 2/2023 | Lin et al. | |
| 2023/0134741 | A1 * | 5/2023 | Huang | H10D 30/6735 257/401 |
| 2023/0187531 | A1 * | 6/2023 | Xie | H10D 64/017 257/347 |
| 2024/0339498 | A1 * | 10/2024 | Yoo | H10D 84/017 |

* cited by examiner 10
11T
11D
94
90
88
92
52
22B
20'
86
20
64
60
62
58

THROUGH-SUBSTRATE VIA AND METHOD FOR FORMING THE SAME

PRIORITY CLAIM AND CROSS-REFERENCE

This application claims the benefit of U.S. Provisional Application No. 63/505,455, filed on Jun. 1, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
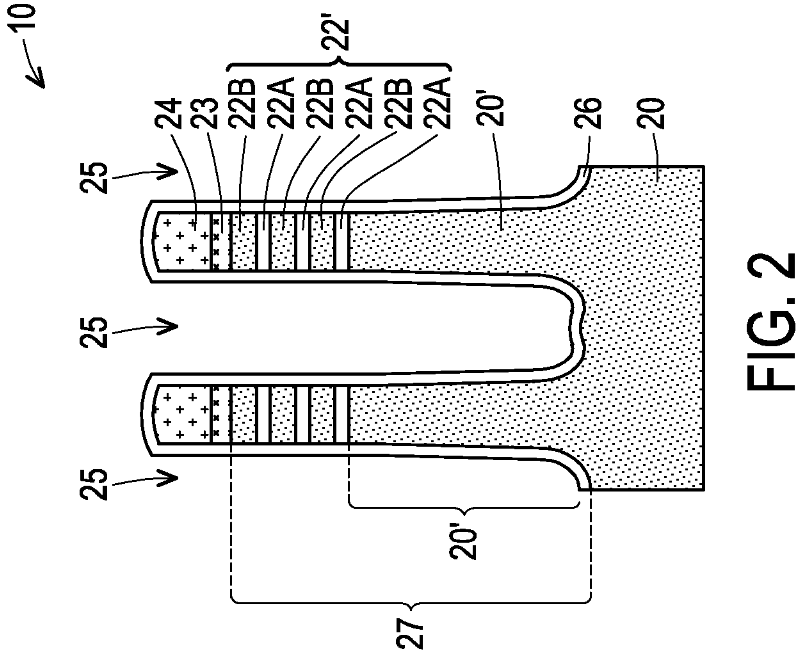
FIGS. 1, 2, 3, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 12A, 12B, 12C, 13A, 13B, 13C, 14A, 14B, 14C, 15A, 15B, 15C, 16A, 16B, 16C, 17, and 18 illustrate various views of intermediate steps in the formation of a through-substrate via and a nanostructure transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a through-substrate via is formed in a region comprising isolation structures and/or epitaxial structures. In some embodiments, the through-substrate via extends through the isolation structures and/or epitaxial structures. By forming the isolation structures before forming the through-substrate via, the processing may be improved such that devices may be formed closer to the through-substrate via, thus increasing device density. Further, by forming epitaxial structures (e.g., source/drain regions) before forming the through-substrate via, stress from the through-substrate via may be reduced, improving device yield and performance.

The disclosed nanostructure field effect transistors (NSFETs) embodiments could also be applied to other nanostructure devices such as nanosheet devices, nanowire devices, gate-all-around (GAA) devices, nano-FETs, or the like. Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the NSFETs. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 1:
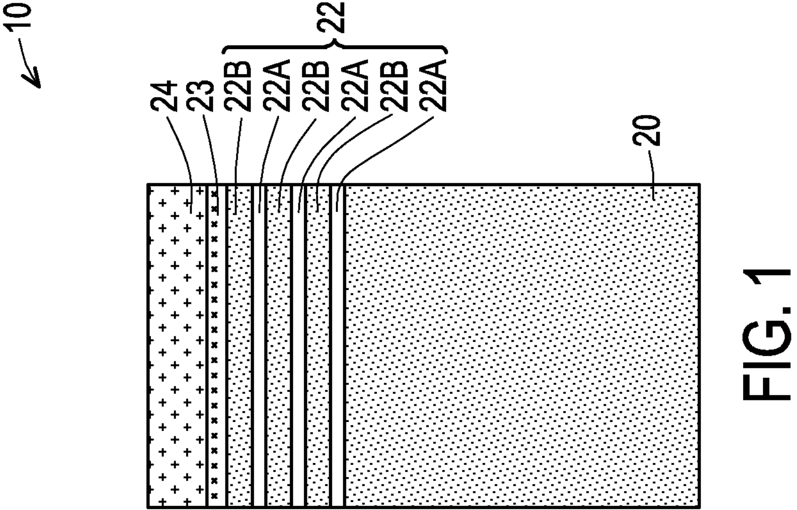

Referring to FIG. 1, a cross-sectional view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used.

In accordance with some embodiments, multilayer stack 22 is formed through a series of deposition processes for depositing alternating materials. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises silicon; germanium; a compound semiconductor including silicon carbide, gallium arsenide, gallium phosphide, indium phosphide, indium arsenide, and/or indium antimonide; an alloy semiconductor including silicon germanium (SiGe), gallium arsenide phosphide, aluminum indium arsenide, aluminum gallium arsenide, gallium indium arsenide, gallium indium phosphide, and/or gallium indium arsenide phosphide; the like, or combinations thereof. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises silicon; germanium; a compound semiconductor including silicon carbide, gallium arsenide, gallium phosphide, indium phosphide, indium arsenide, and/or indium antimonide; an alloy semiconductor including silicon germanium (SiGe), gallium arsenide phosphide, aluminum indium arsenide, aluminum gallium arsenide, gallium indium arsenide, gallium indium phosphide, and/or gallium indium arsenide phosphide; the like, or combinations thereof, in which the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, pad layer 23 and hard mask 24 are deposited over multilayer stack 22. Pad layer 23 (sometimes referred to as a sacrificial layer) may be formed of a compound comprising silicon and another material(s) selected from carbon, oxide, nitrogen, or combinations thereof. Hard mask 24 may be formed of or comprise silicon nitride.

Referring to FIG. 2, hard mask 24 and pad 23 are patterned. Next, multilayer stack 22 and a portion of the underlying substrate 20 are patterned in an etching process(es), so that trenches 25 are formed. Trenches 25 extend into substrate 20. The remaining portions of multilayer stacks are referred to as multilayer stacks 22' hereinafter. Underlying multilayer stacks 22', some portions of substrate 20 are left, and are referred to as substrate strips 20' or fins 20' hereinafter. Multilayer stacks 22' include semiconductor layers 22A and 22B. Semiconductor layers 22A are alternatively referred to as sacrificial layers, and semiconductor layers 22B are alternatively referred to as nanostructures hereinafter. The portions of multilayer stacks 22' and the underlying substrate strips 20' are collectively referred to as semiconductor strips 27.

In above-illustrated embodiments, the nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the structure.

FIGS. 2, 3, 4A, 4B, and 4C illustrate the formation of isolation regions 30, which are also referred to as Shallow Trench Isolation (STI) regions throughout the description. Referring to FIG. 2, dielectric liner 26, which may be a conformal dielectric layer, is deposited. Dielectric liner 26 may comprises silicon oxide, silicon nitride, or the like, and may be formed using, for example, ALD, High-Density Plasma Chemical Vapor Deposition (HDPCVD), CVD, or the like.

Figure 3:
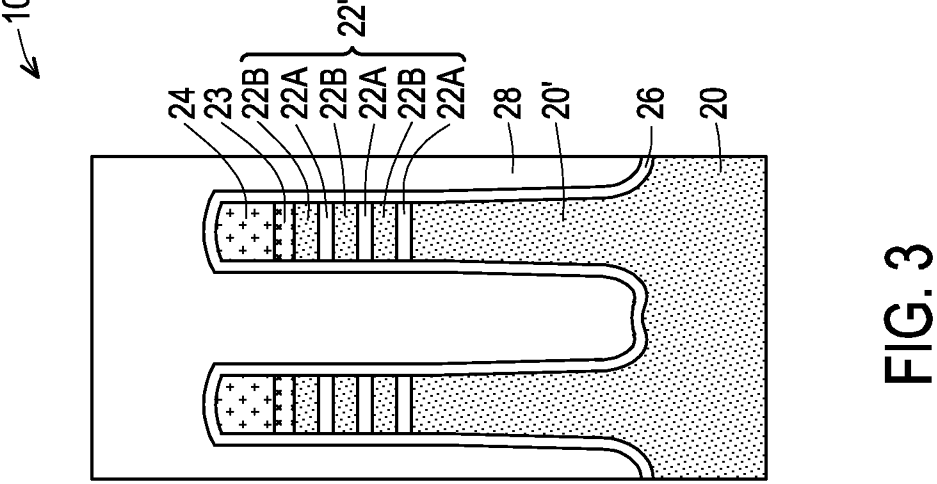

Next, referring to FIG. 3, dielectric material 28 is deposited over dielectric liner 26. Dielectric material 28 may comprise silicon oxide or other dielectric material comprising carbon, nitrogen, or the like, and may be formed using Flowable Chemical Vapor Deposition (FCVD), spin-on coating, HDPCVD, ALD, CVD, or the like.

The subsequent figure numbers in FIGS. 4A, 4B, and 4C through FIGS. 16A, 16B, and 16C may have the corresponding numbers followed by letter A, B, or C. The Figures whose reference numbers include letter A show perspective views. The Figures whose reference numbers include letter B illustrate the cross-sectional views obtained from the vertical plane X-X (FIG. 4A) in the corresponding perspective view. The Figures whose reference numbers include letter C illustrate the cross-sectional views obtained from the vertical plane Y-Y (FIG. 4A) in the corresponding perspective view.

Figure 4A:
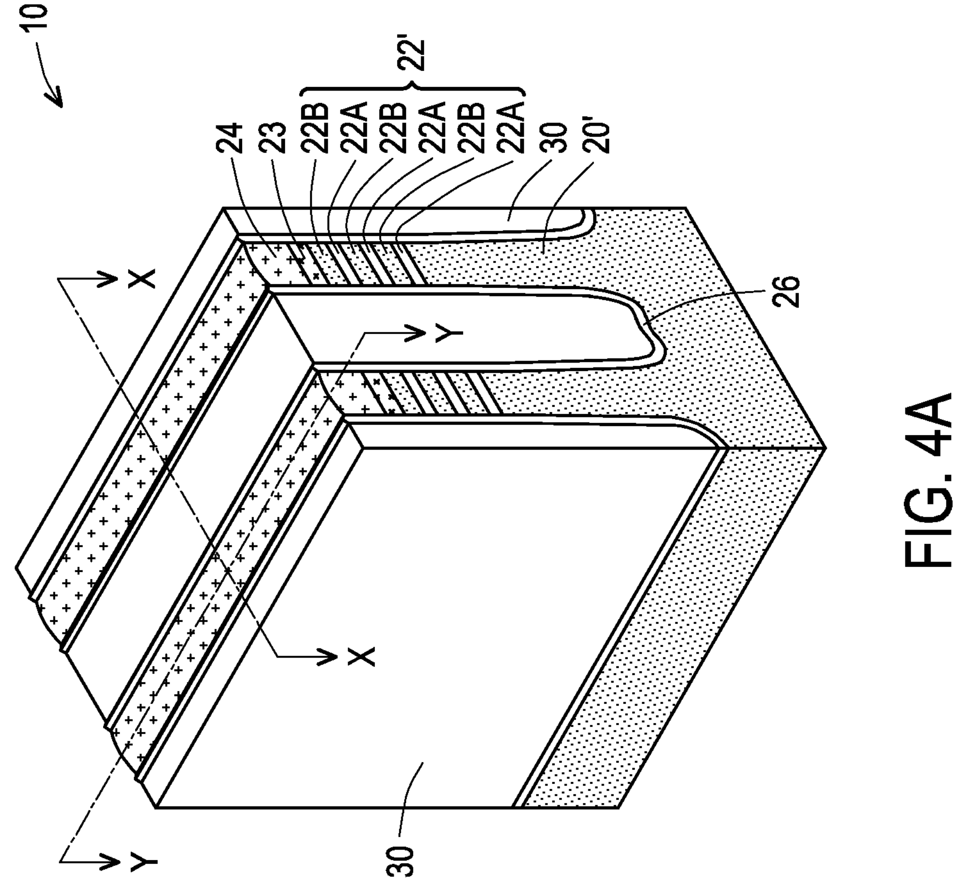
Figure 4C:
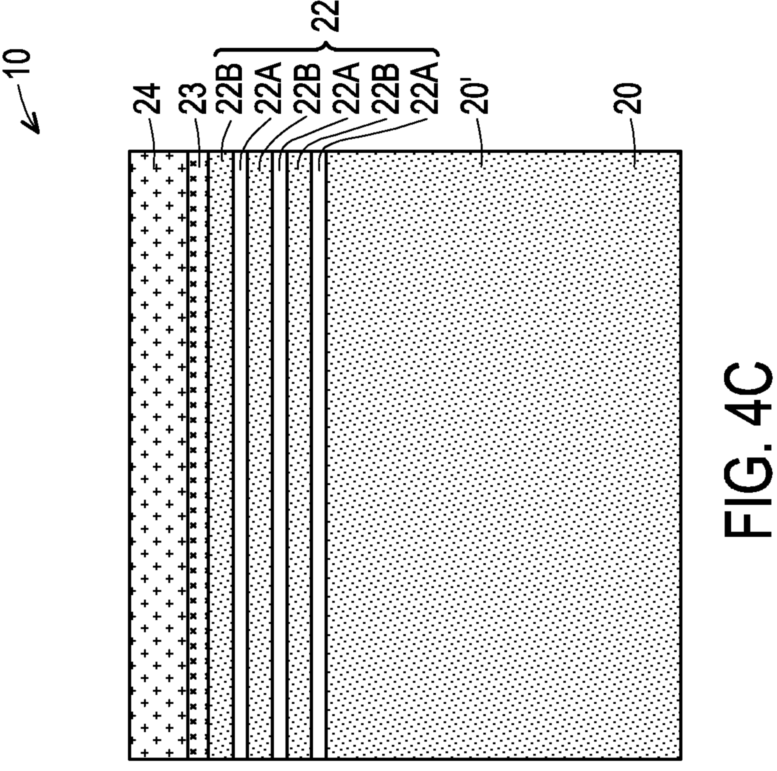
Figure 4B:
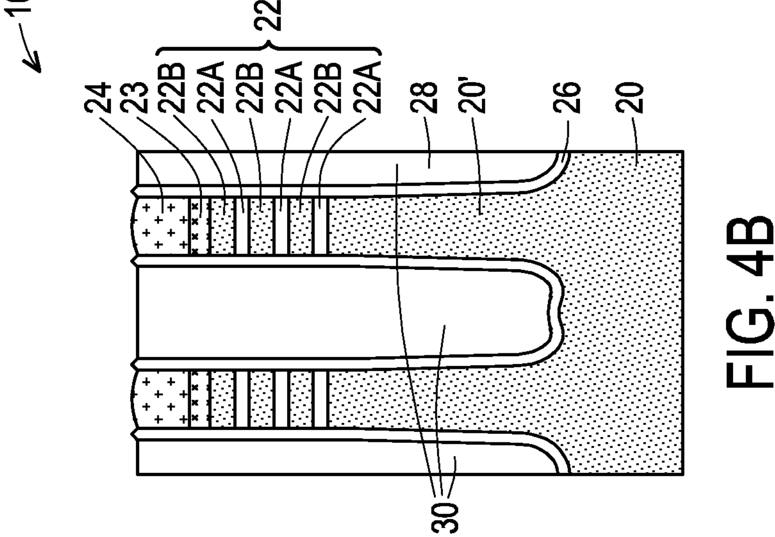

Referring to FIGS. 4A, 4B, and 4C, a planarization process such as a Chemical Mechanical Polish (CMP) process or a mechanical grinding process is performed to polish and level the top surface of the dielectric material 28 and dielectric liner 26, and the remaining portions of dielectric material 28 and dielectric liner 26 are STI regions 30. In the planarization process, either hard mask 24 or pad layer 23 may be used as a polish stop layer.

Figure 5A:
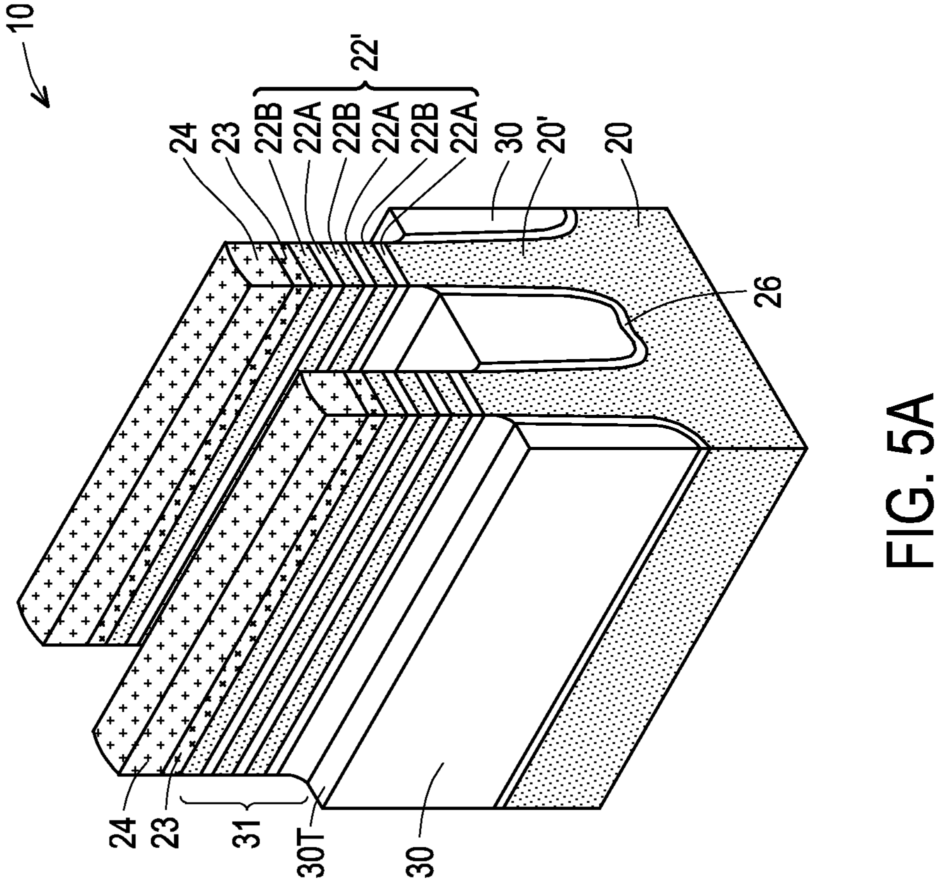
Figure 5C:
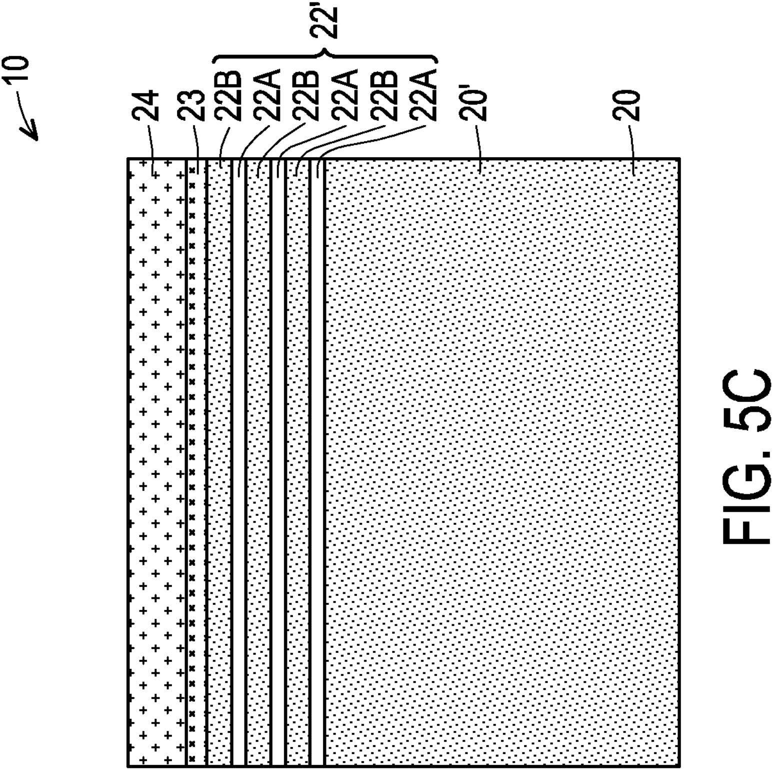
Figure 5B:
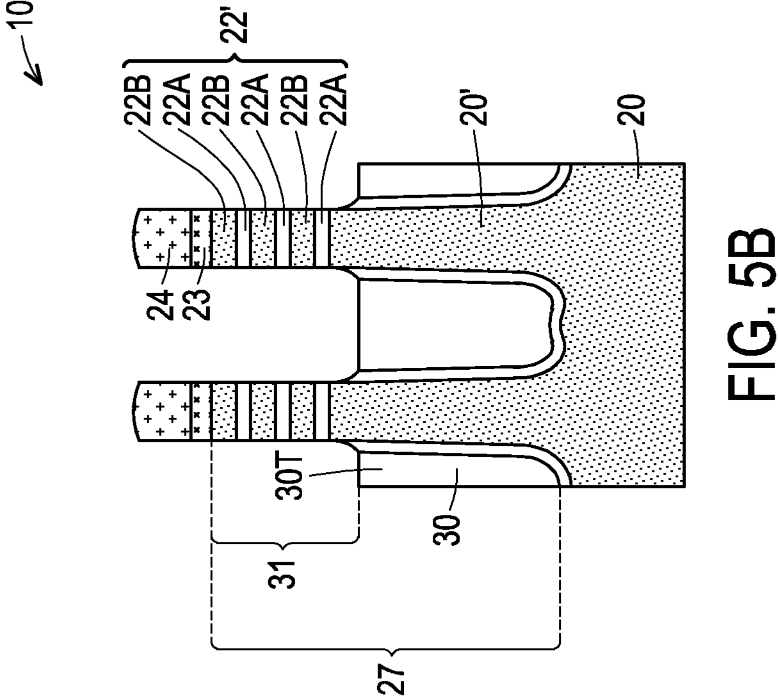

Referring to FIGS. 5A, 5B, and 5C, STI regions 30 are recessed, so that the top portions of semiconductor strips 27 (FIG. 5B) protrude higher than the top surfaces 30T of the remaining portions of STI regions 30 to form protruding fins 31. Protruding fins 31 include multilayer stacks 22' and the top portions of substrate strips 20'. The recessing of STI regions 30 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 30 is performed through a wet etching process. The etching chemical may include HF, for example.

Figure 6A:
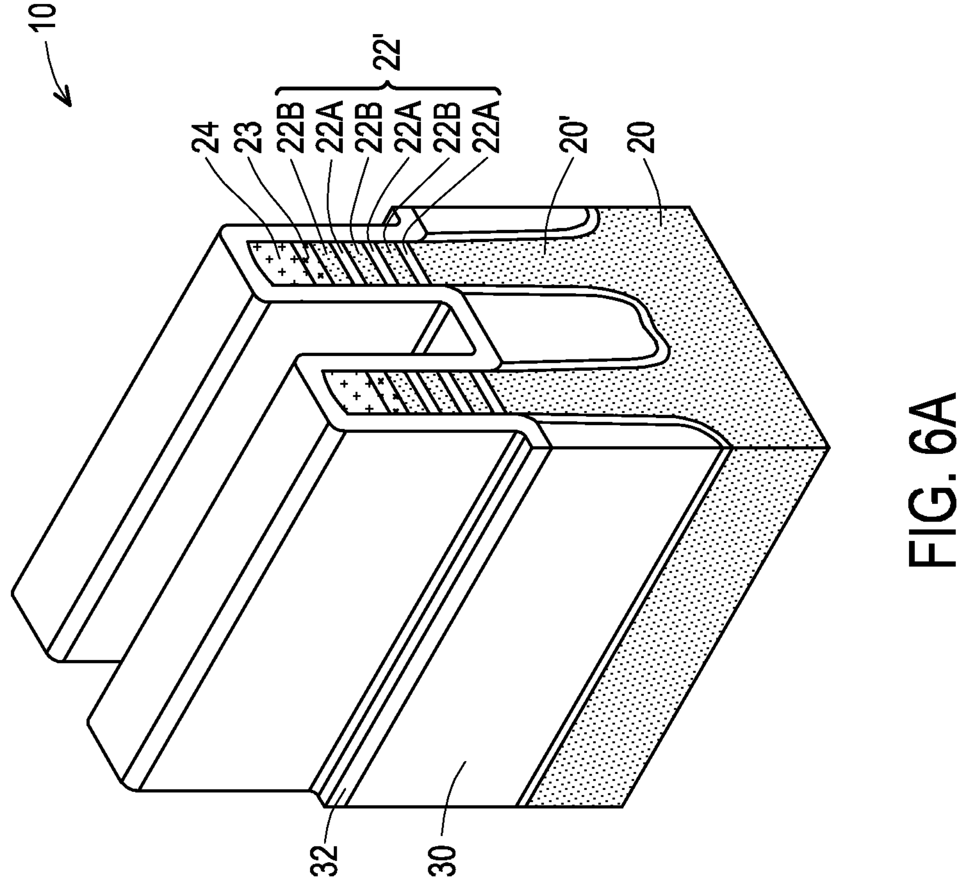
Figure 6C:
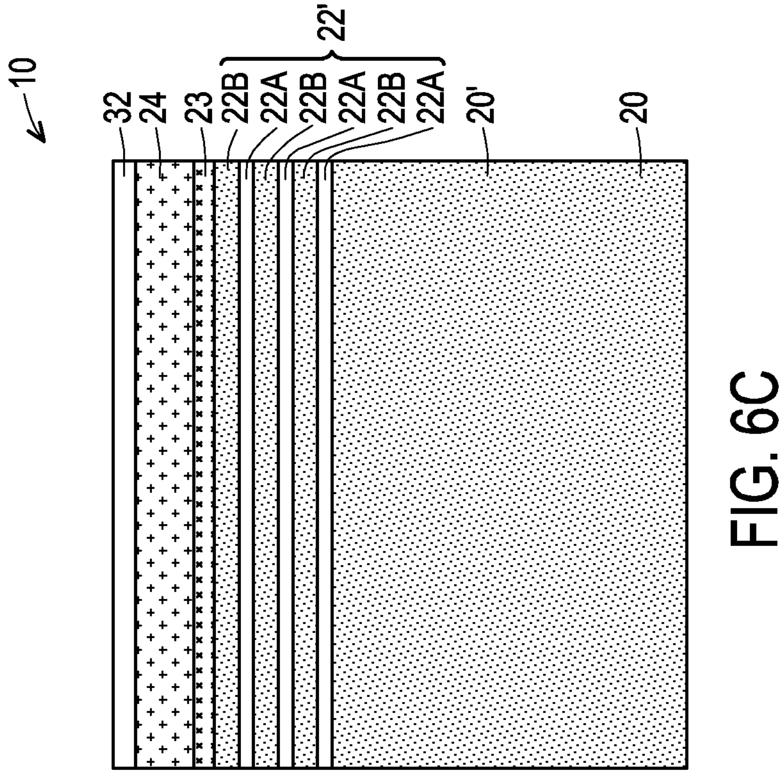
Figure 6B:
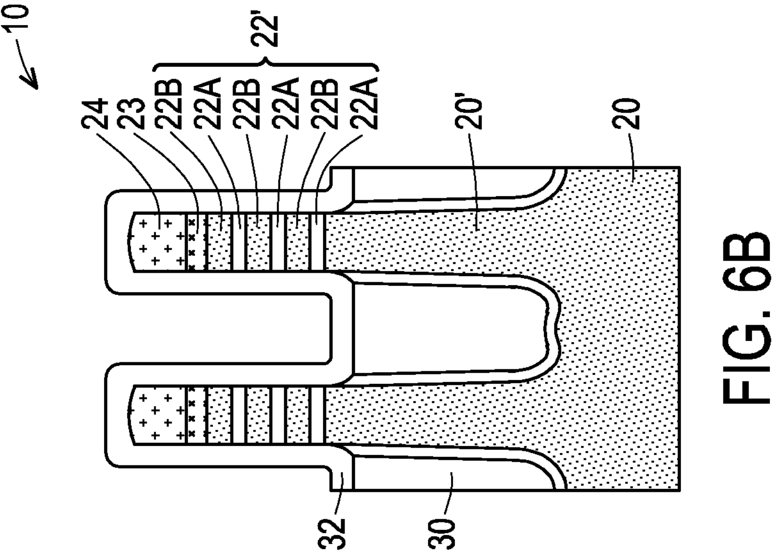

Referring to FIGS. 6A, 6B, and 6C, cladding SiGe layer 32 is deposited. Cladding SiGe layer 32 may be formed through a conformal deposition process such as ALD, CVD, or the like. In accordance with alternative embodiments, cladding SiGe layer 32 is not formed. An anisotropic etching process may then be performed to remove horizontal portions of cladding SiGe layer 32, leaving the vertical portions of cladding SiGe layer 32.

Figure 7A:
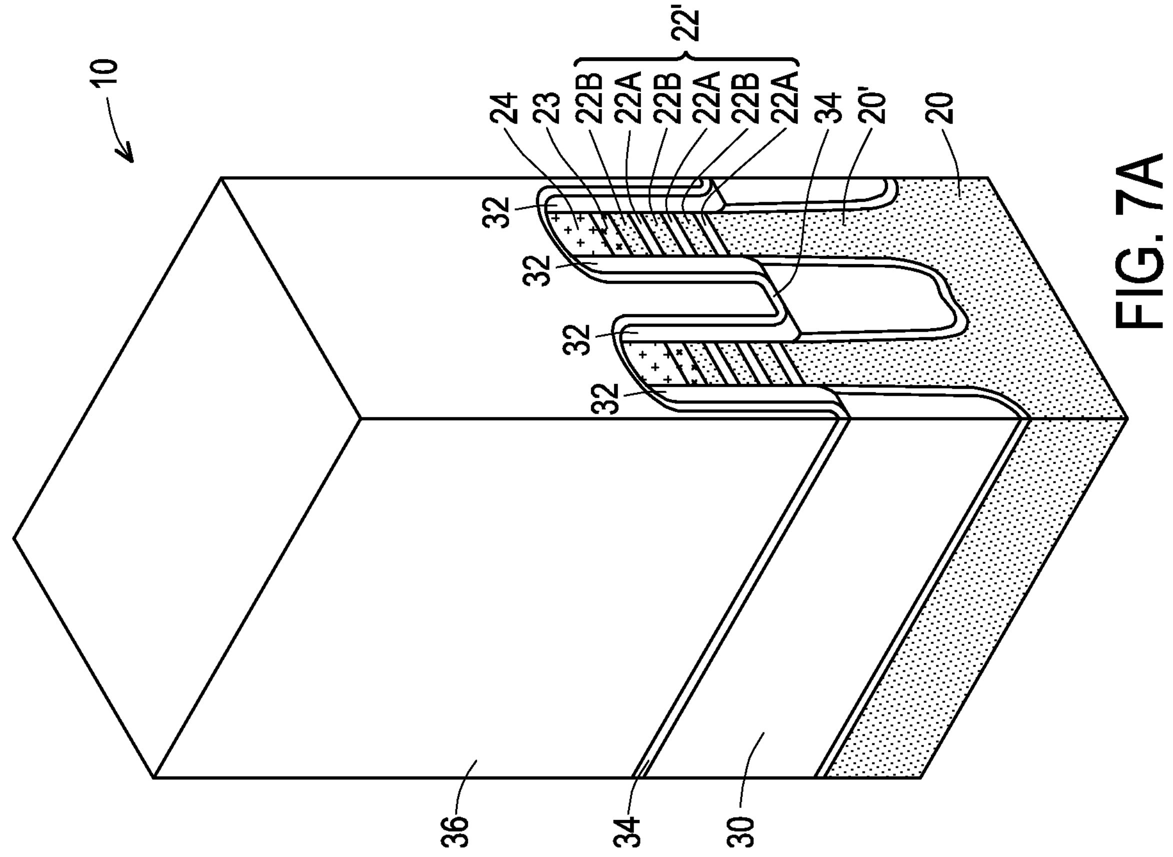
Figure 7C:
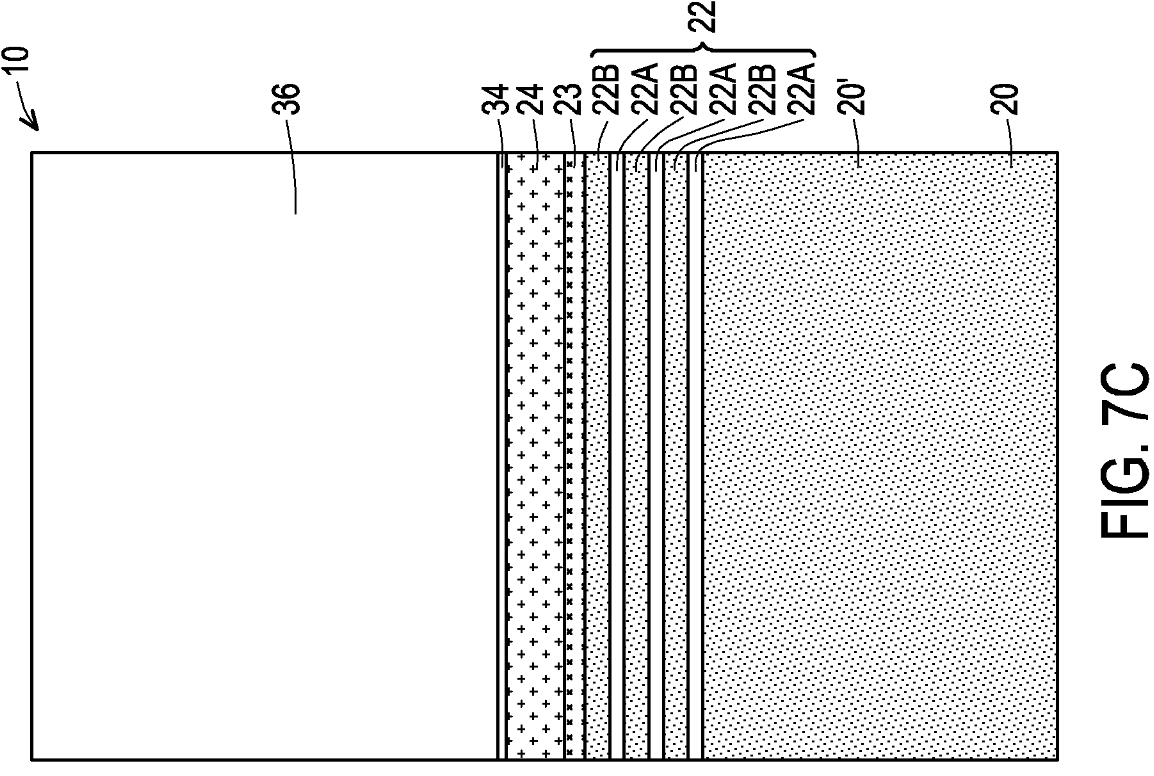
Figure 7B:
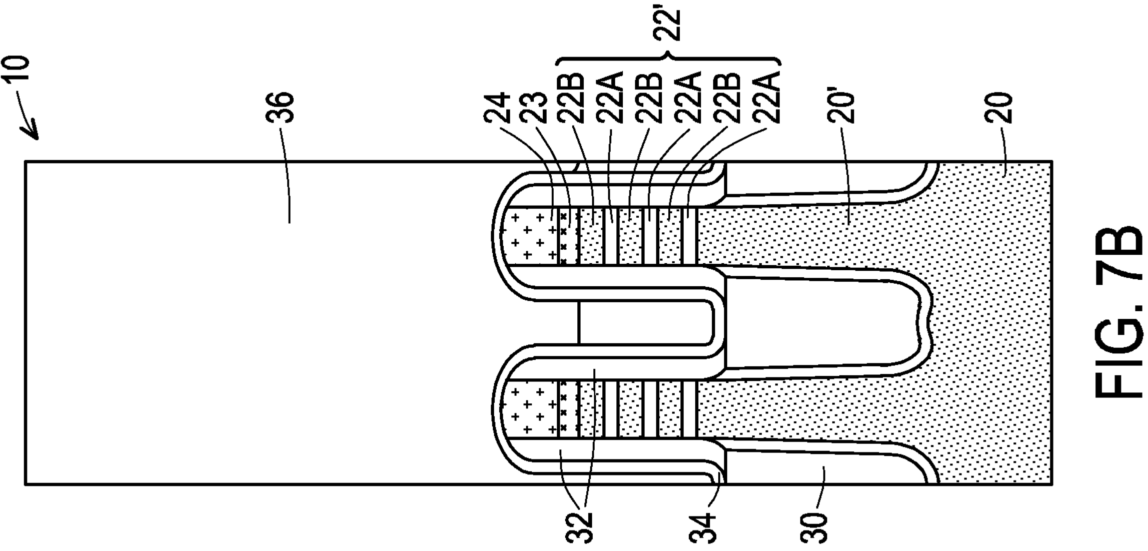

In FIGS. 7A, 7B, and 7C, dielectric liner 34 is formed, followed by the deposition of dielectric layer 36. Dielectric liner 34 may be formed of or comprise, for example, silicon carbo-nitride, silicon oxycarbide, silicon nitride, or the like, and may be formed through a conformal deposition process such as ALD, CVD, or the like. Dielectric layer 36 may be formed of or comprise silicon oxide, and may be formed through a deposition process, spin-on coating, or the like.

Figure 8A:
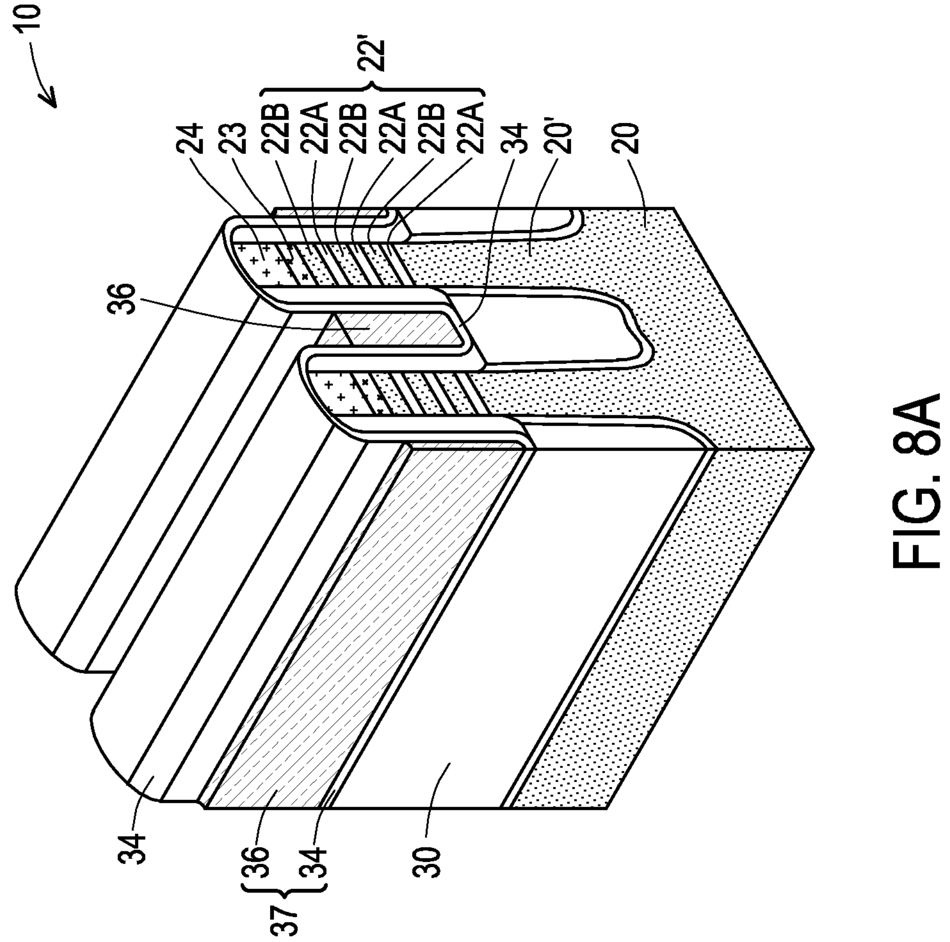
Figure 8C:
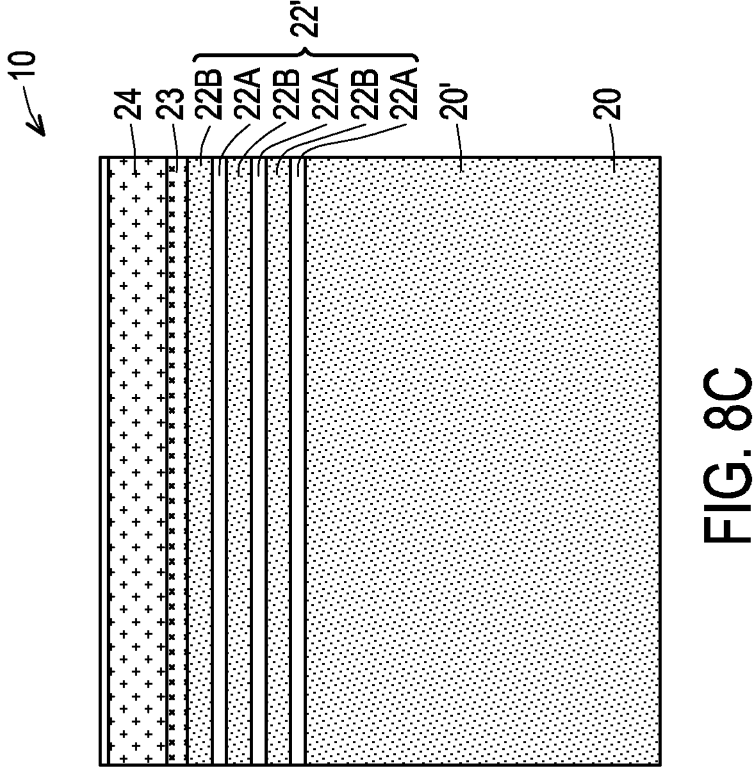
Figure 8B:
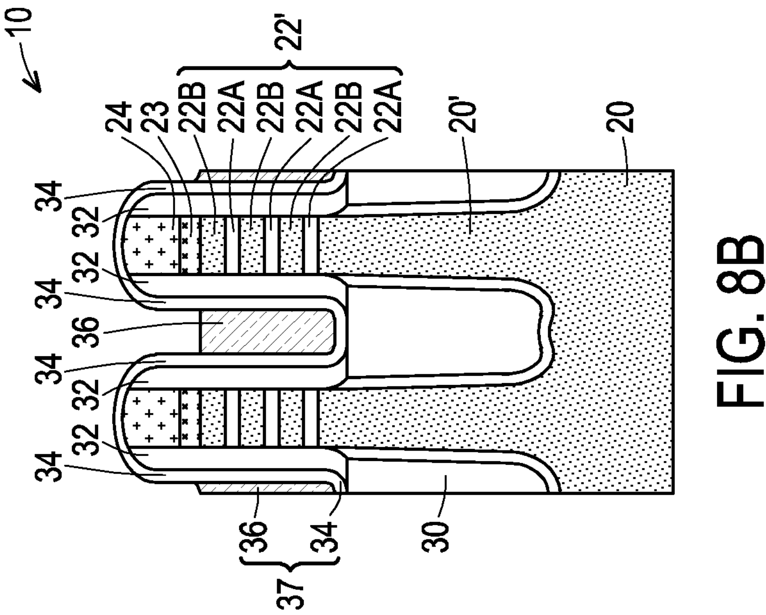

FIGS. 8A, 8B, and 8C illustrate the etch-back of dielectric layer 36 and dielectric layer 34. The remaining dielectric liner 34 and dielectric layer 36 are in the gaps between neighboring multilayer stacks 22', and are collectively referred to as dielectric regions 37. In accordance with some embodiments, the top surface of dielectric layer 36 is level with or lower than the top ends of multilayer stacks 22'. By controlling etching processes, the top ends of dielectric liner 34 may be higher than the top surface of dielectric layer 36 in accordance with some embodiments.

Figure 9A:
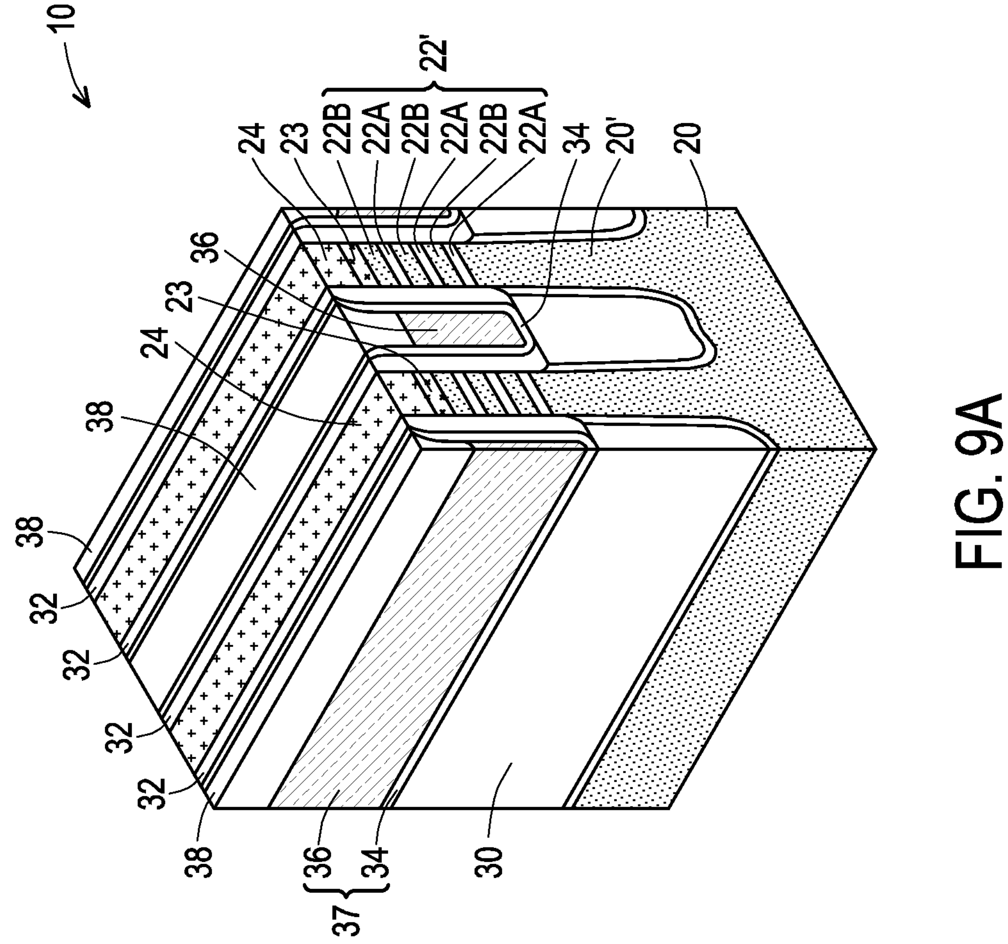
Figure 9C:
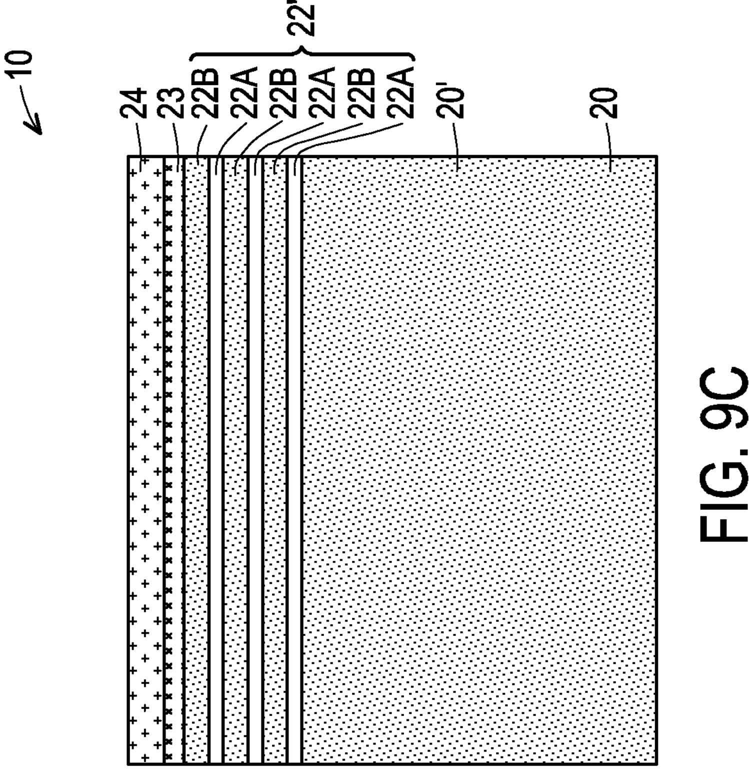
Figure 9B:
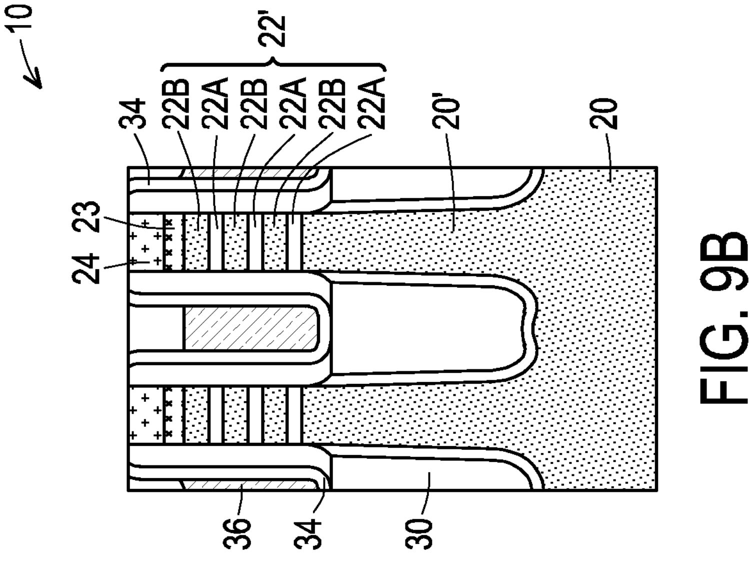

FIGS. 9A, 9B, and 9C illustrate the formation of high-k dielectric regions 38. In accordance with some embodiments, dielectric region 38 is deposited through High-density Plasma Chemical Vapor Deposition (HDPCVD), PECVD, ALD, CVD, or the like. The material of dielectric region 38 may be selected from hafnium oxide, zirconium oxide, aluminum oxide, aluminum nitride, titanium nitride, silicon oxide, silicon nitride, silicon oxynitride, silicon oxycarbonitride, or the like. A planarization process is then performed to level the top surfaces of dielectric regions 38 with hard masks 24 in accordance with some embodiments.

Figure 10A:
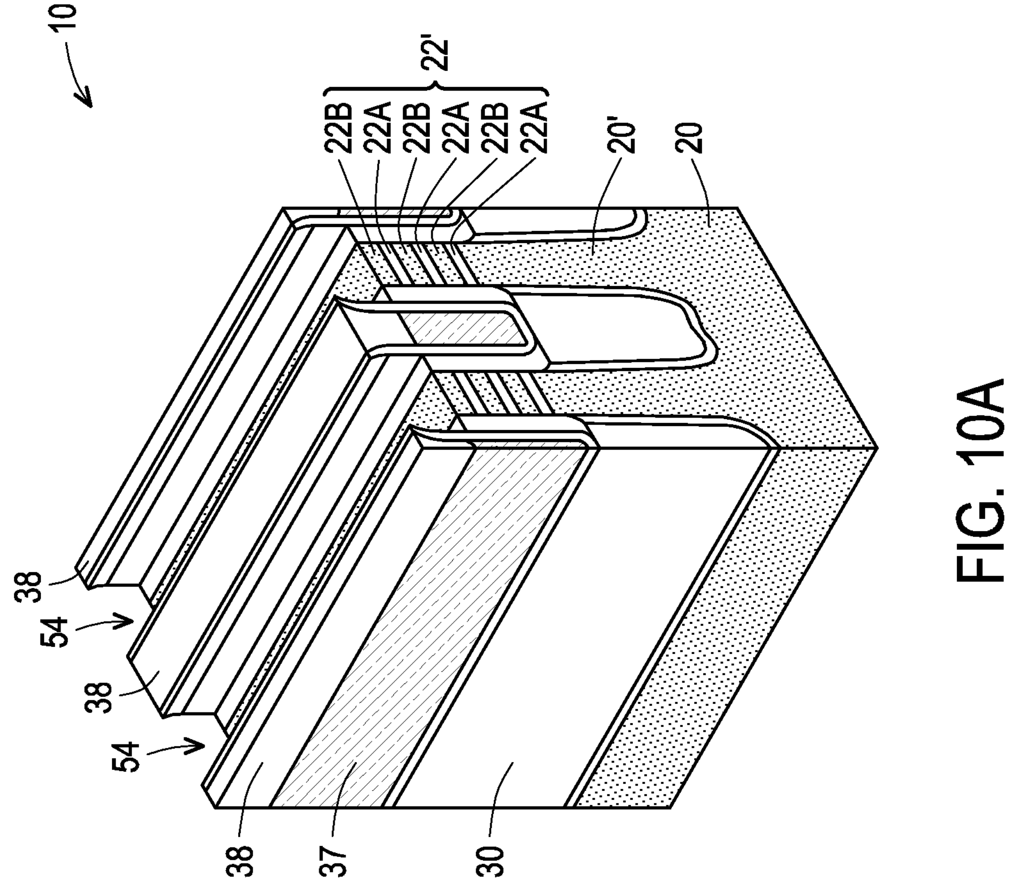
Figure 10C:
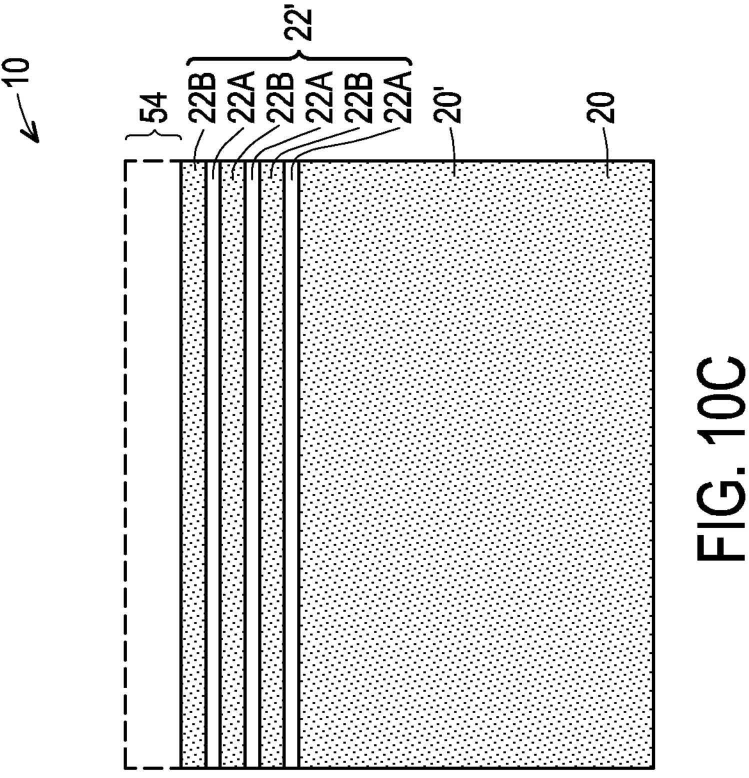
Figure 10B:
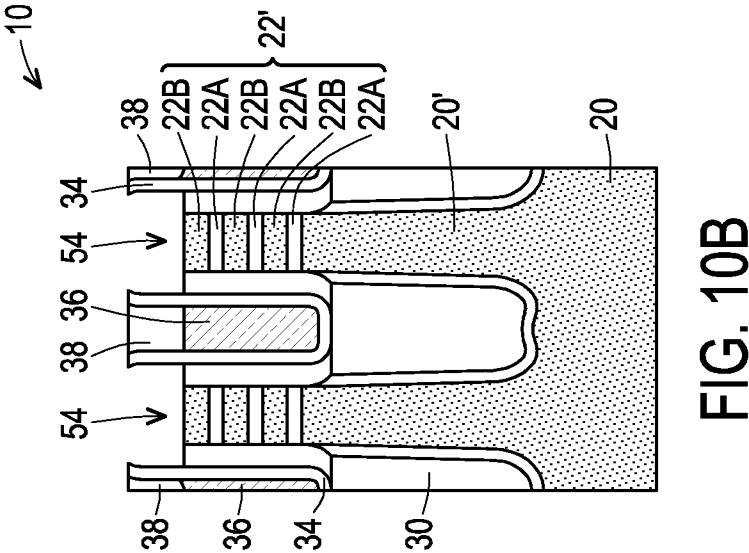

Next, hard masks 24 and pad layers 23 are removed, for example, in dry etching processes and/or wet etching processes. Accordingly, as shown in FIGS. 10A, 10B, and 10C, recesses 54 are formed between high-k dielectric regions 38, which may protrude higher than multilayer stacks 22'.

Figure 11A:
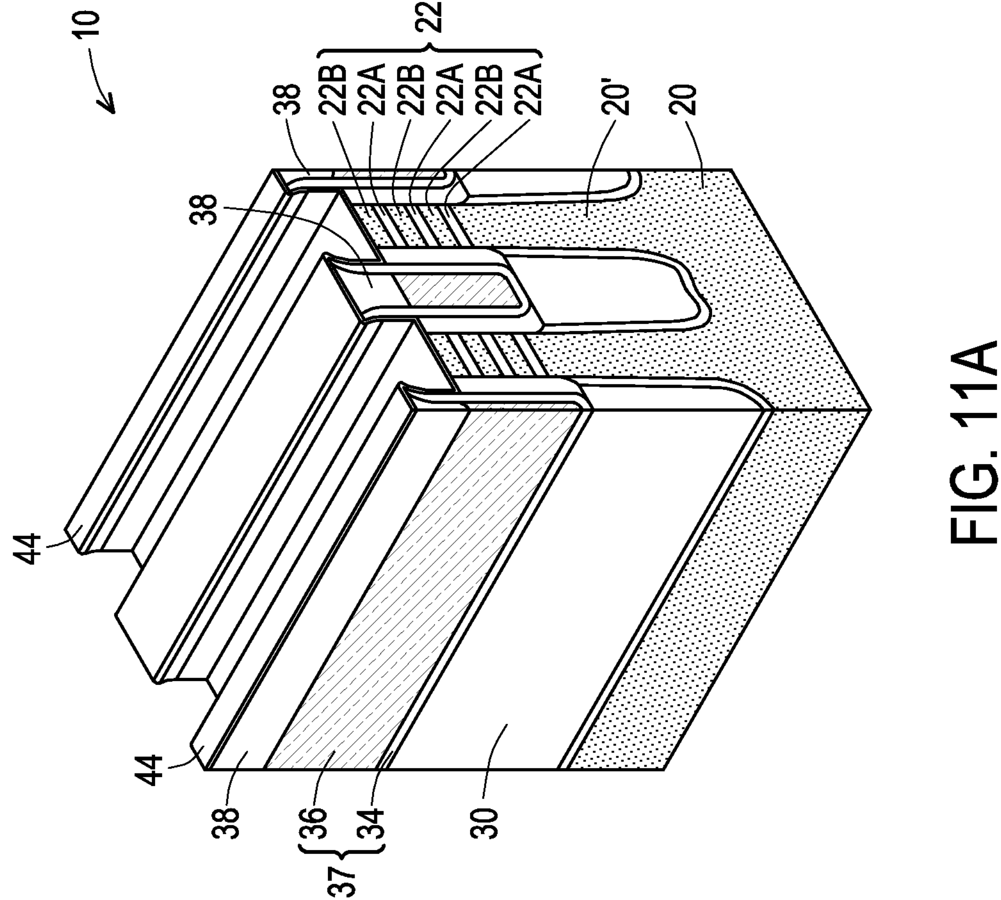
Figure 11B:
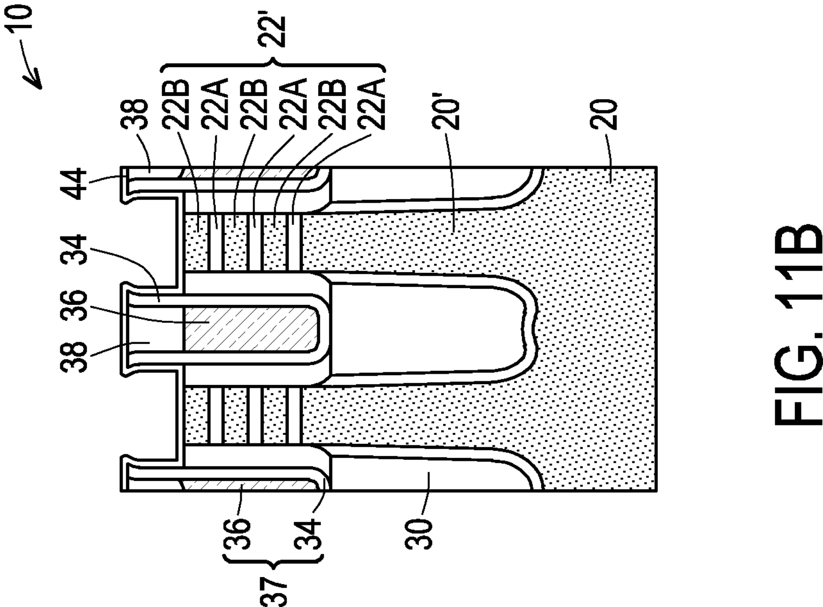

FIGS. 11A and 11B illustrate the formation of dummy gate dielectric layer 44, which is formed as a conformal layer. In accordance with some embodiments, dummy gate dielectric layer 44 is deposited, for example, using a conformal deposition process such as ALD, CVD, or the like. Dummy gate dielectric layer 44 may be formed of or comprise silicon oxide in accordance with some embodiments. Dummy gate dielectric layer 44 extends into recesses 54, and extends on the top surfaces of high-k dielectric regions 38.

Figure 12A:
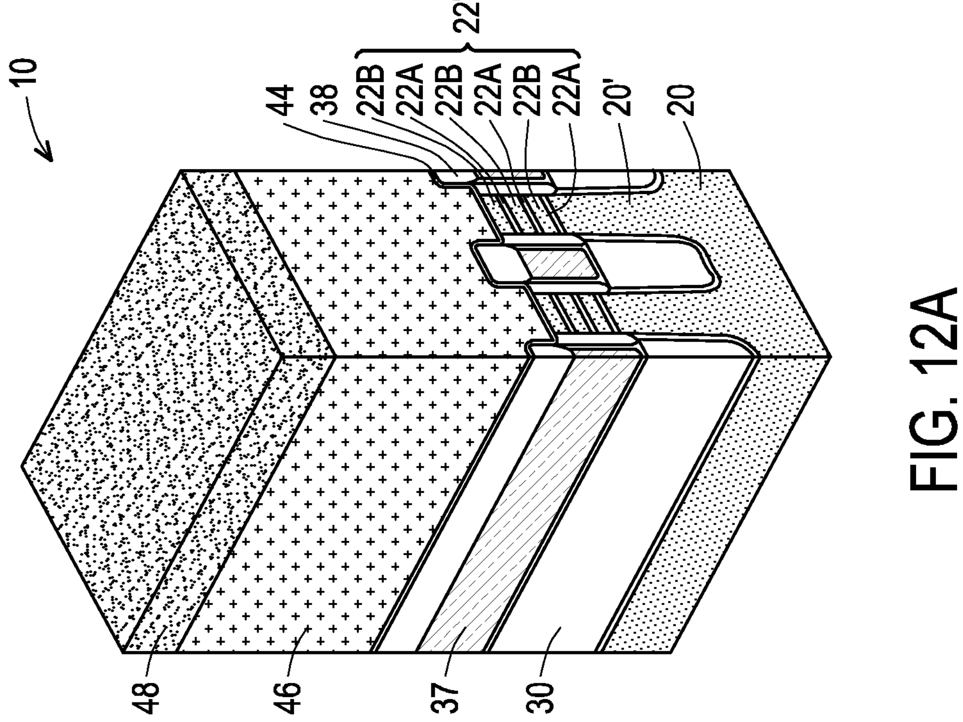
Figure 12C:
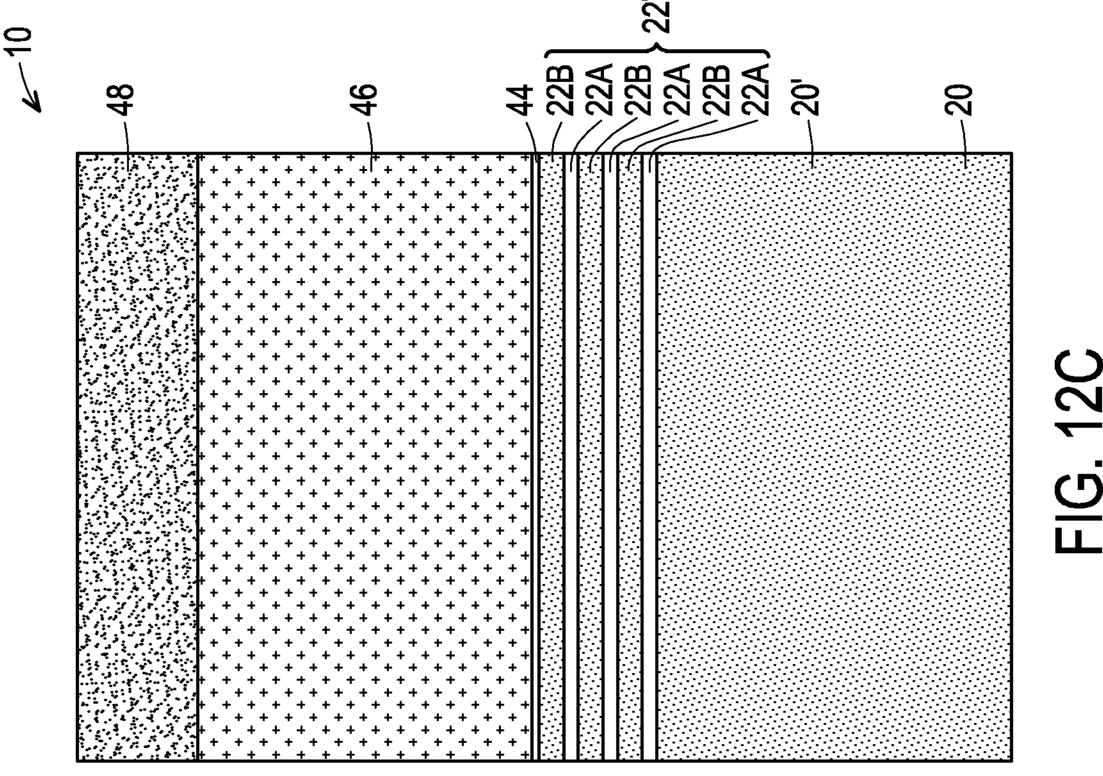
Figure 12B:
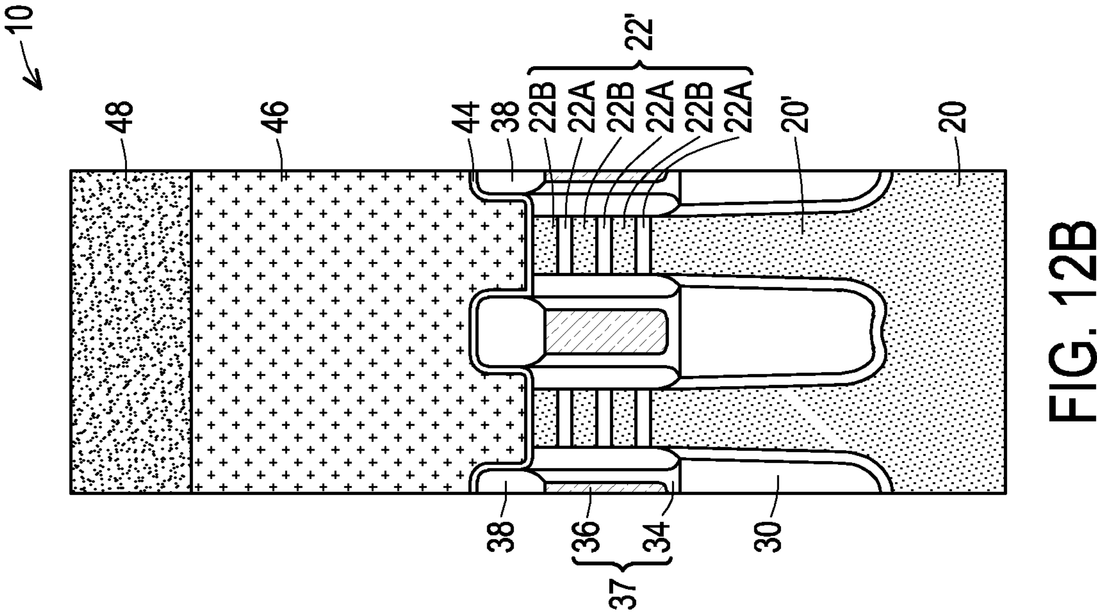

FIGS. 12A, 12B, and 12C illustrate the deposition of dummy gate electrode layer 46. In accordance with some embodiments, dummy gate electrode layer 46 is formed of or comprises polysilicon, amorphous silicon, or the like. Hard mask layers 48 are also formed over dummy gate electrode layer 46. Hard mask layers 48 may be formed of silicon nitride, silicon oxide, silicon carbonitride, silicon oxycarbonitride, or the like, or multilayers thereof.

Figure 13A:
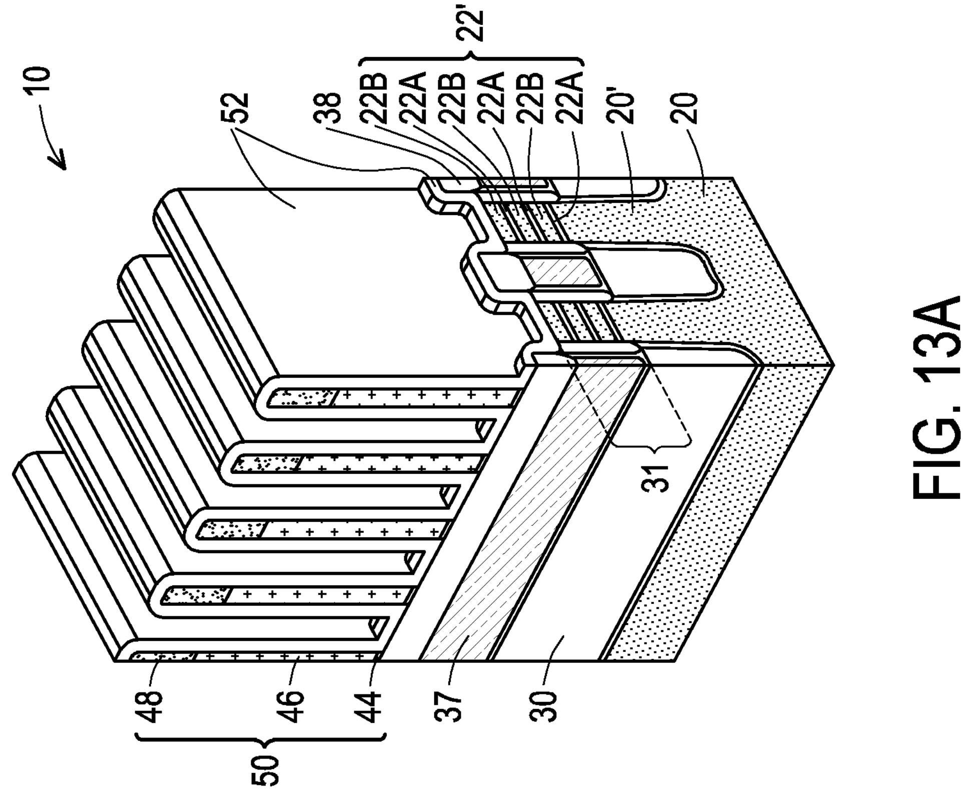
Figure 13C:
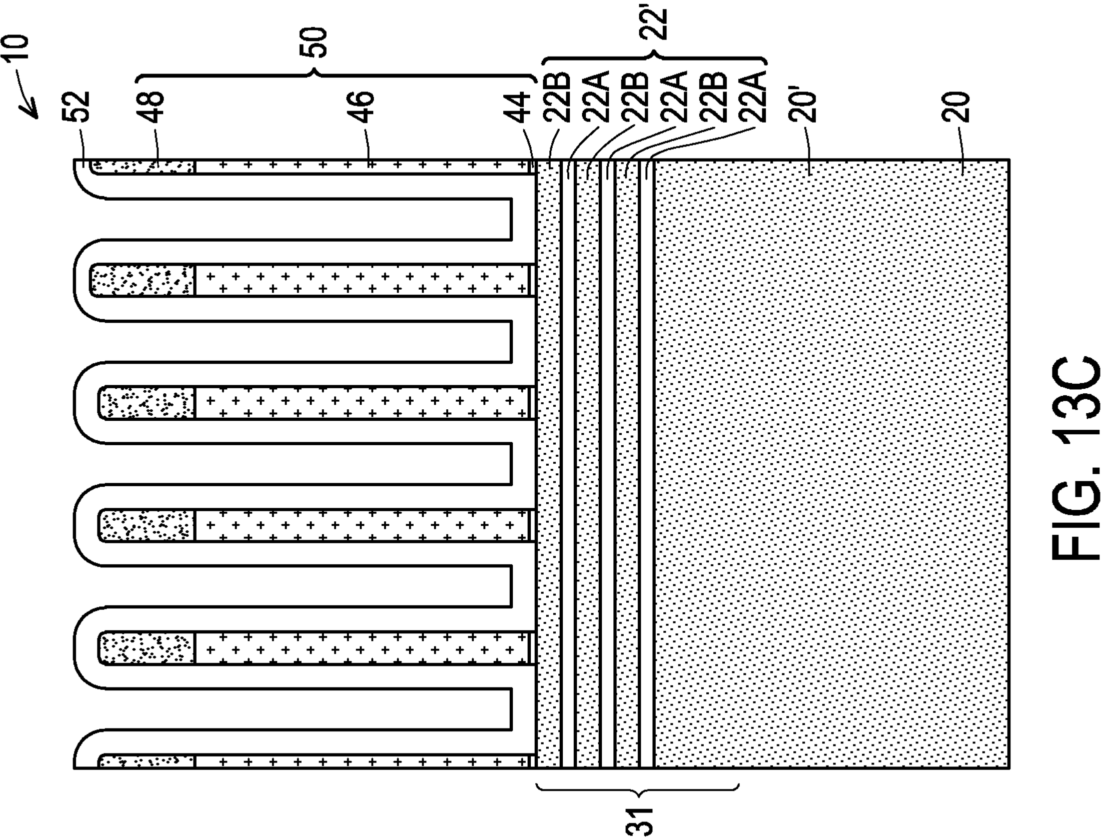
Figure 13B:
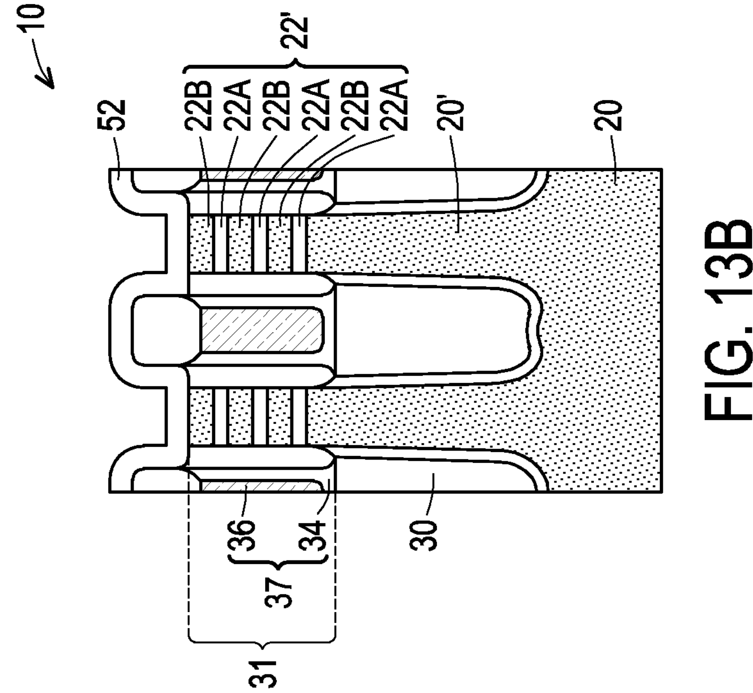

Next, as shown in FIGS. 13A, 13B, and 13C, hard mask layer 48, dummy gate electrode layer 46, and dummy gate dielectric layer 44 are patterned in etching processes, hence forming dummy gate stacks 50. The remaining portions of hard mask layer 48, dummy gate electrode layer 46, and dummy gate dielectric layer 44 are referred to as hard masks 48, dummy gate electrodes 46, and dummy gate dielectrics 44, respectively.

Next, gate spacer layer 52 is deposited, for example, through a conformal deposition process such as ALD, CVD, or the like. In accordance with some embodiments, gate spacer layer 52 is formed of a dielectric material such as silicon nitride, silicon oxide, silicon carbonitride, silicon oxynitride, silicon oxycarbonitride, or the like, and may have a single-layer structure or a multilayer structure including a plurality of dielectric layers. After the deposition process, an anisotropic etching process(es) may be performed to etch the horizontal portions of gate spacer layer 52, leaving vertical portions of gate spacer layer 52 unremoved. The remaining portions of the dielectric layer(s) are referred to as gate spacers 52. In subsequent figures, gate stacks 50 are shown, while dummy gate dielectric layer 44 and dummy gate electrode layer 46 may not (or may) be shown separately.

Figure 14A:
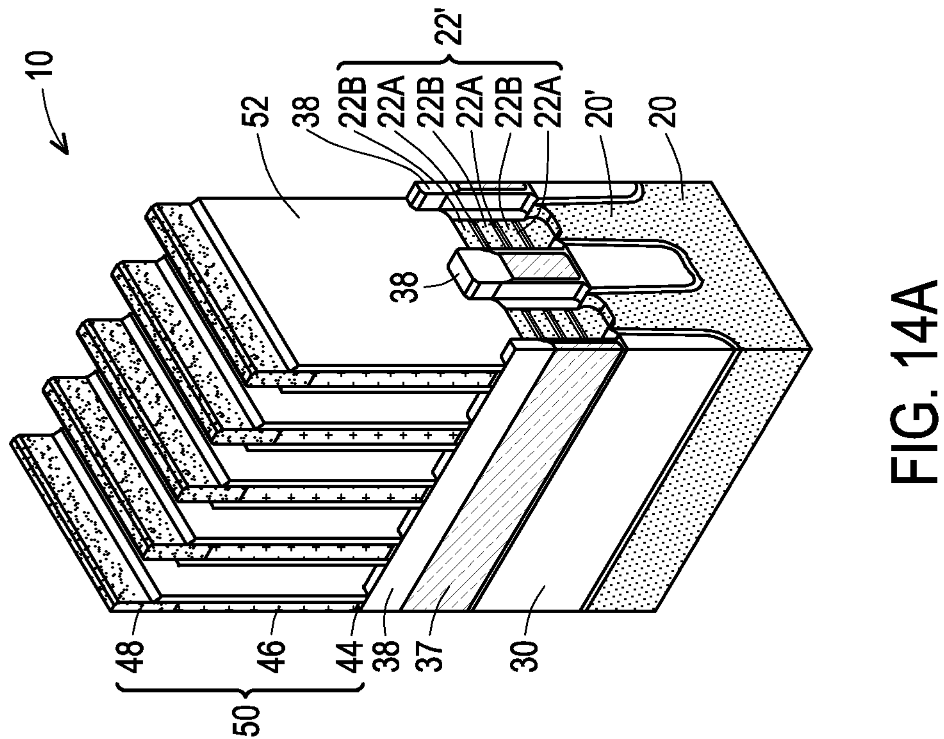
Figure 14C:
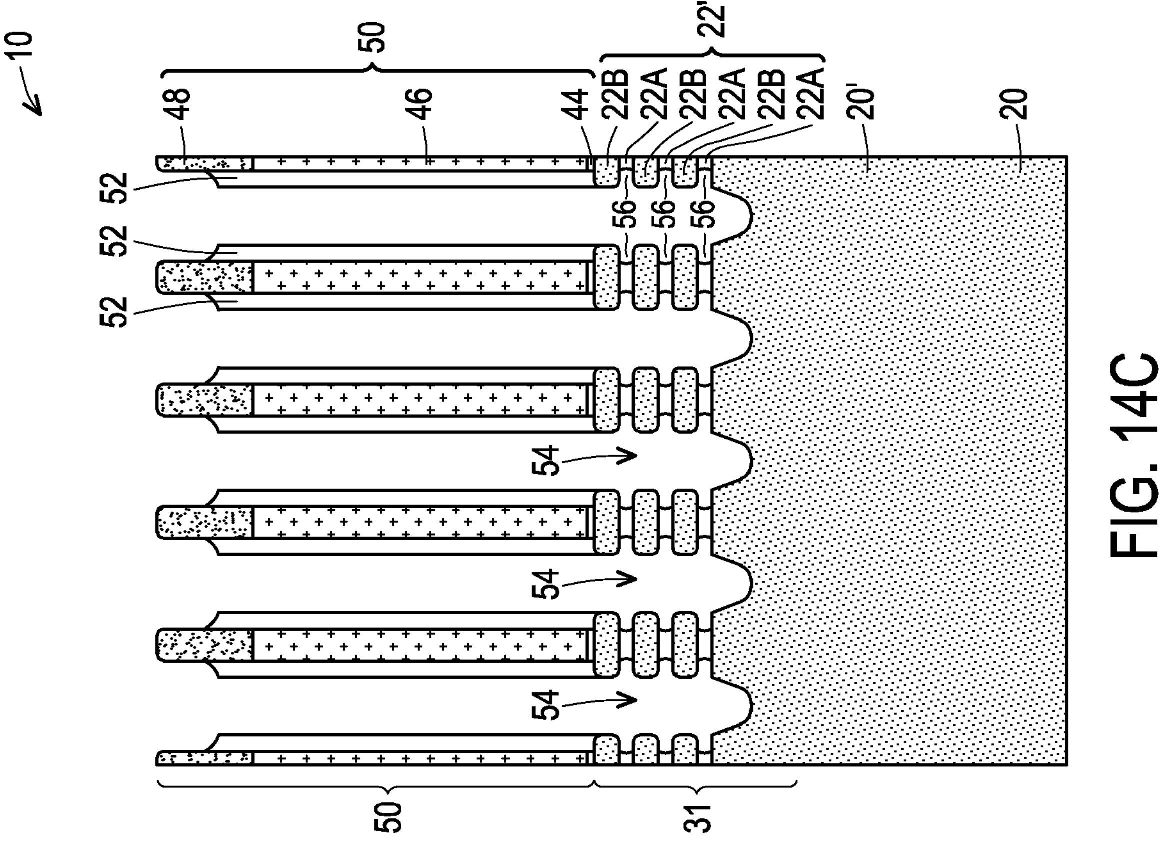
Figure 14B:
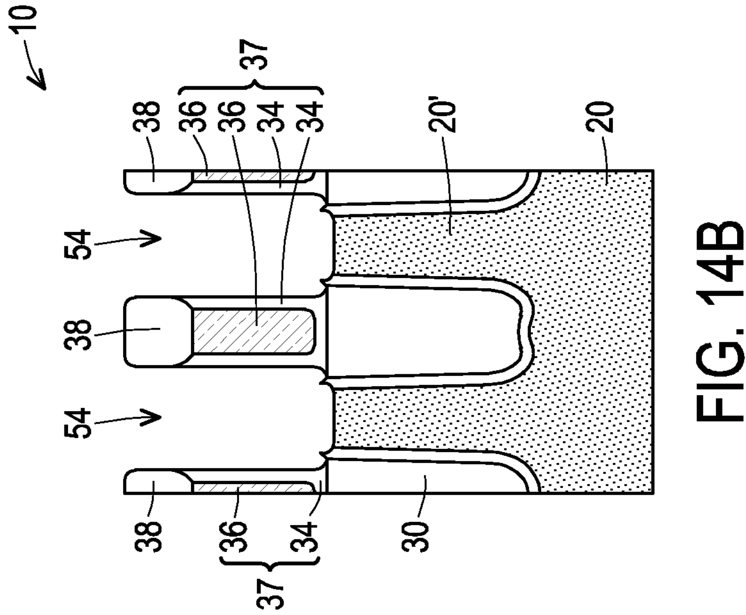

FIGS. 14A, 14B, and 14C illustrate a resulting structure after the formation of gate spacers 52, which are in the plane shown in FIGS. 14A and 14C. Next, the portions of protruding fins 31 (FIGS. 13A, 13B, and 13C) that are not directly underlying dummy gate stacks 50 and gate spacers 52 are recessed through an etching process to form recesses 54, which are between the un-etched portions of protruding fins 31. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 54 are at least level with, or may be lower than (as shown in FIG. 14C), the bottoms of multilayer semiconductor stacks 22'. The etching may be anisotropic, so that the sidewalls of multilayer semiconductor stacks 22' facing recesses 54 are vertical and straight.

After the formation of recesses 54, as also shown in FIG. 14C, sacrificial semiconductor layers 22A are laterally recessed to form lateral recesses 56, which are recessed from the edges of the respective overlying and underlying nanostructures 22B. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). In accordance with alternative embodiments, the lateral recessing of sacrificial semiconductor layers 22A is performed through an isotropic dry etching process or a combination of a dry etching process and a wet etching process.

Figure 15A:
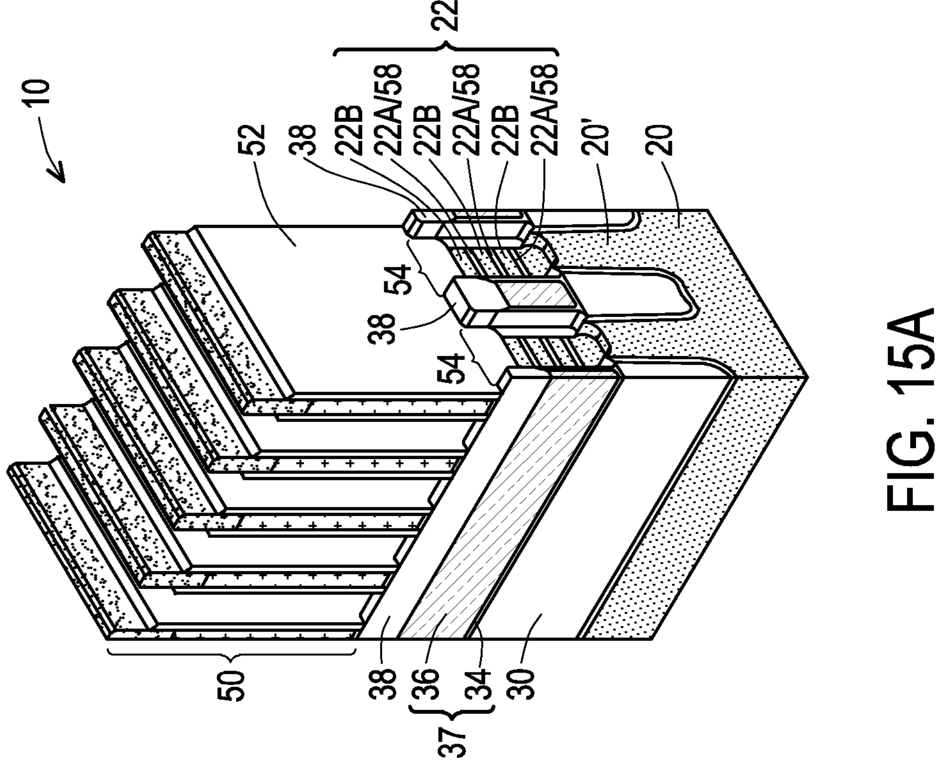
Figure 15C:
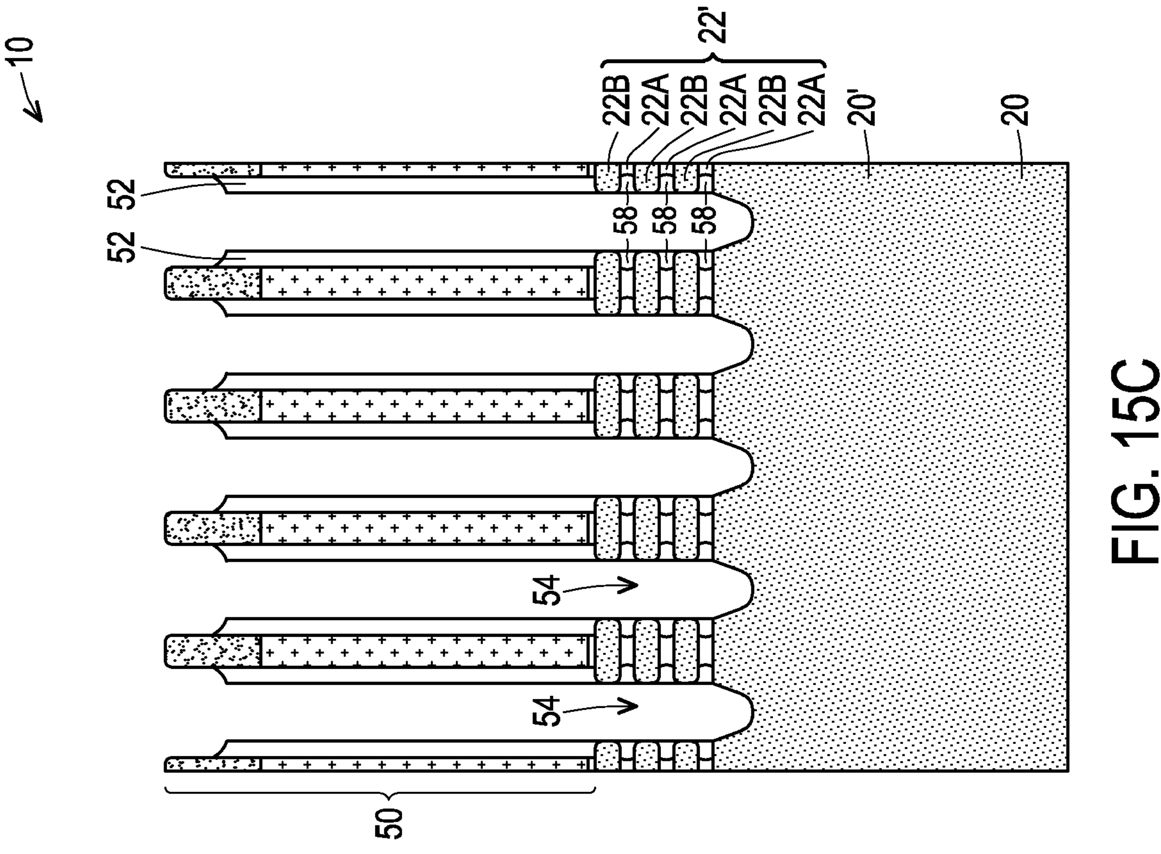
Figure 15B:
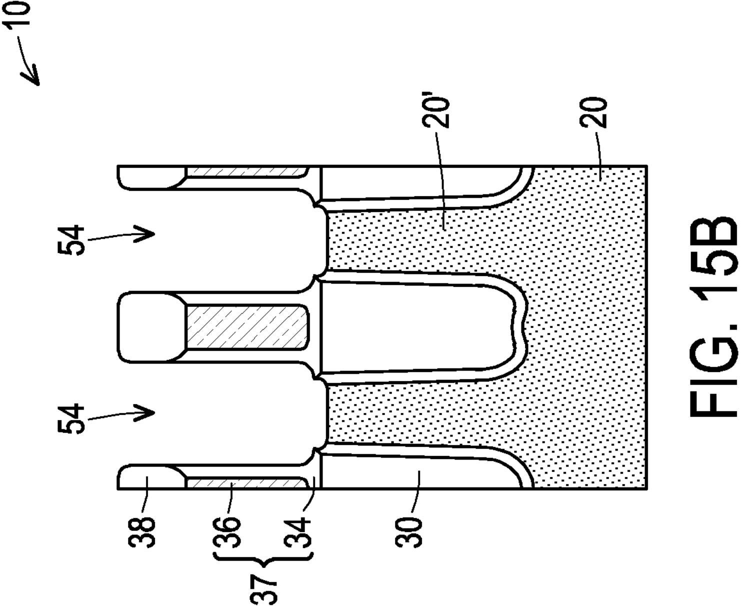

FIGS. 15A, 15B, and 15C illustrate the formation of inner spacers 58. The formation process incudes depositing a spacer layer extending into recesses 56, and performing an etching process to remove the portions of inner spacer layer outside of recesses 56, thus leaving inner spacers 58 in recesses 56. Inner spacers 58 may be formed of or comprise silicon oxycarbonitride, silicon oxynitride, silicon oxycarbide, silicon carbonitride, or the like. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 16A:
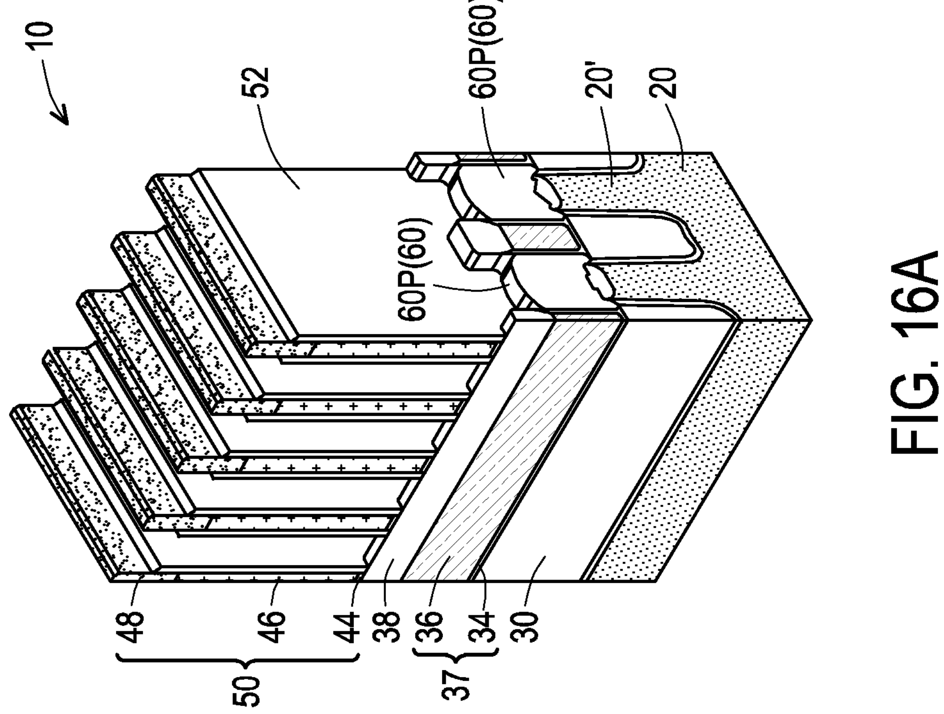
Figure 16C:
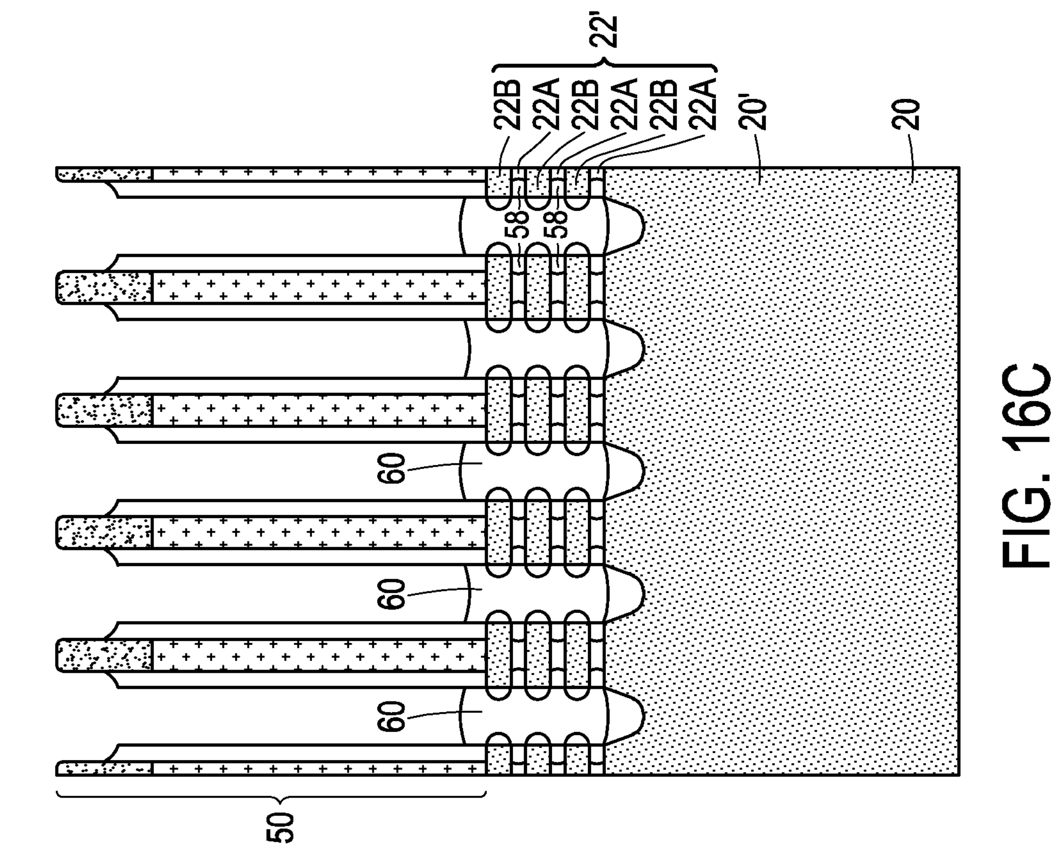
Figure 16B:
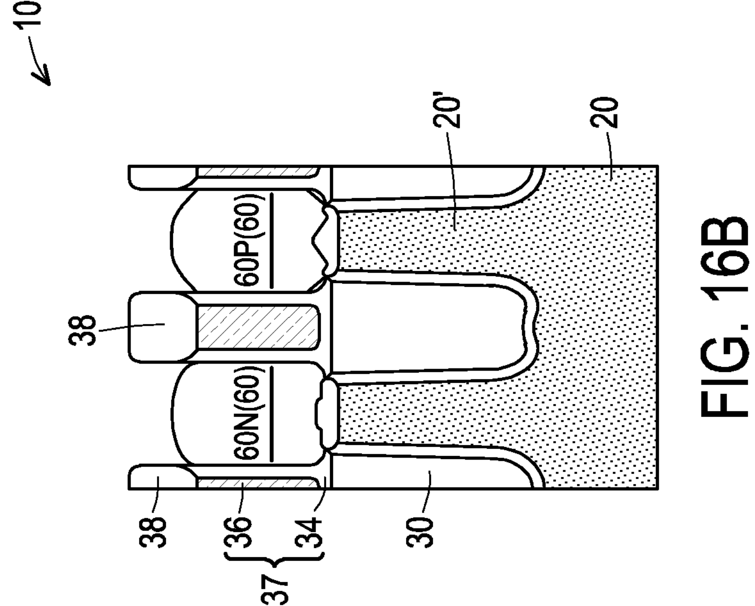

Referring to FIGS. 16A, 16B, and 16C, epitaxial source/drain regions 60 are formed in recesses 54. Source/drain region(s) may refer to a source or a drain, individually or collectively dependent upon the context. In accordance with some embodiments, the source/drain regions 60 may exert stress on the nanostructures 22B, which are used as the channels of the corresponding nanostructure transistors, thereby improving performance. When the resulting transistors are n-type transistors, epitaxial source/drain regions 60 are formed to be n-type by doping an n-type dopant. For example, the n-type source/drain regions 60 may be formed of or comprise silicon phosphorous (SiP), silicon carbon phosphorous (SiCP), or the like. When the resulting transistors are p-type transistors, epitaxial source/drain regions 60 are formed to be p-type by doping a p-type dopant. For example, the p-type source/drain regions 60 may be formed of or comprise silicon germanium boron (SiGeB), silicon boron (SiB), or the like. FIGS. 16A and 16B schematically illustrate an n-type epitaxial source/drain region 60N and a p-type epitaxial source/drain regions 60P as an example. In some cases, the epitaxial source/drain regions 60 formed in the through via region 11T (see FIG. 18) may reduce stress in the through via region 11T due to the presence of the through substrate via 110 (see FIG. 27). Reducing stress by forming epitaxial source/drain regions 60 in the through via region 11T can improve yield and improve device reliability.

Figure 17:
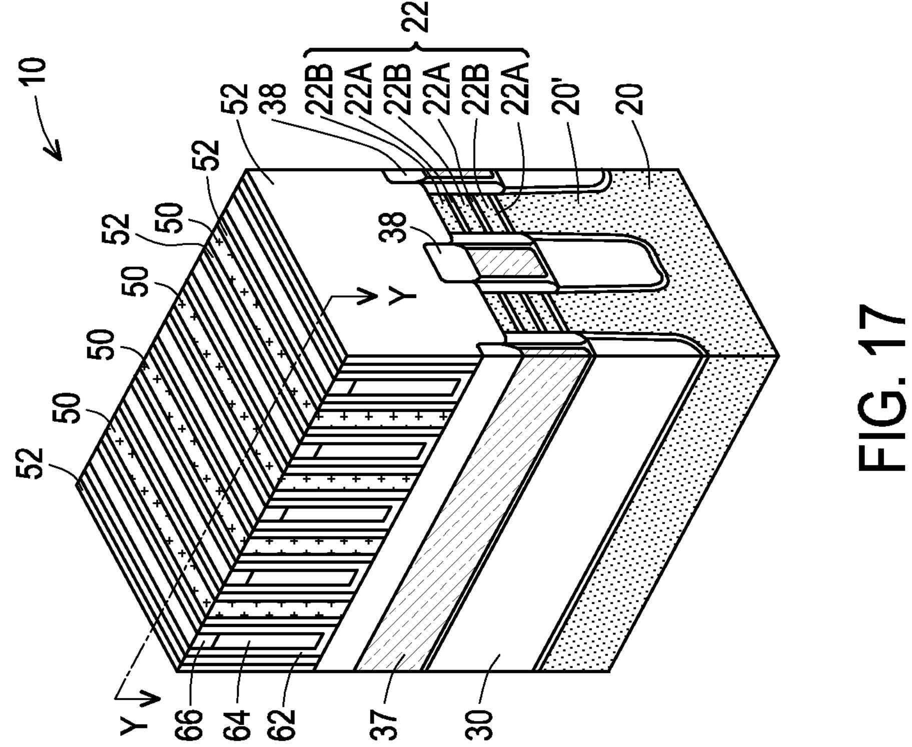

FIGS. 17 through 27 illustrate intermediate steps in the formation of a through substrate via 110, in accordance with some embodiments. FIG. 17 illustrates a perspective view following the step shown in FIGS. 16A-16C. FIGS. 18 through 24 illustrate cross-sectional views obtained from the vertical plane Y-Y described previously and as also indicated in FIG. 17 for reference. Each of FIGS. 18 through 24 illustrates a cross-sectional view in a region 11T of the structure in which a through substrate via 110 (see FIG. 27) is formed and a cross-sectional view in a region 11D of the structure in which devices (e.g., NSFETs or other devices) are formed. The through via region 11T may be physically separated from the device region 11D, and any number of device features (e.g., other active devices, doped regions, isolation structures, dummy structures, guard rings, etc.) may be disposed between the region 11T and the region 11D.

Figure 18:
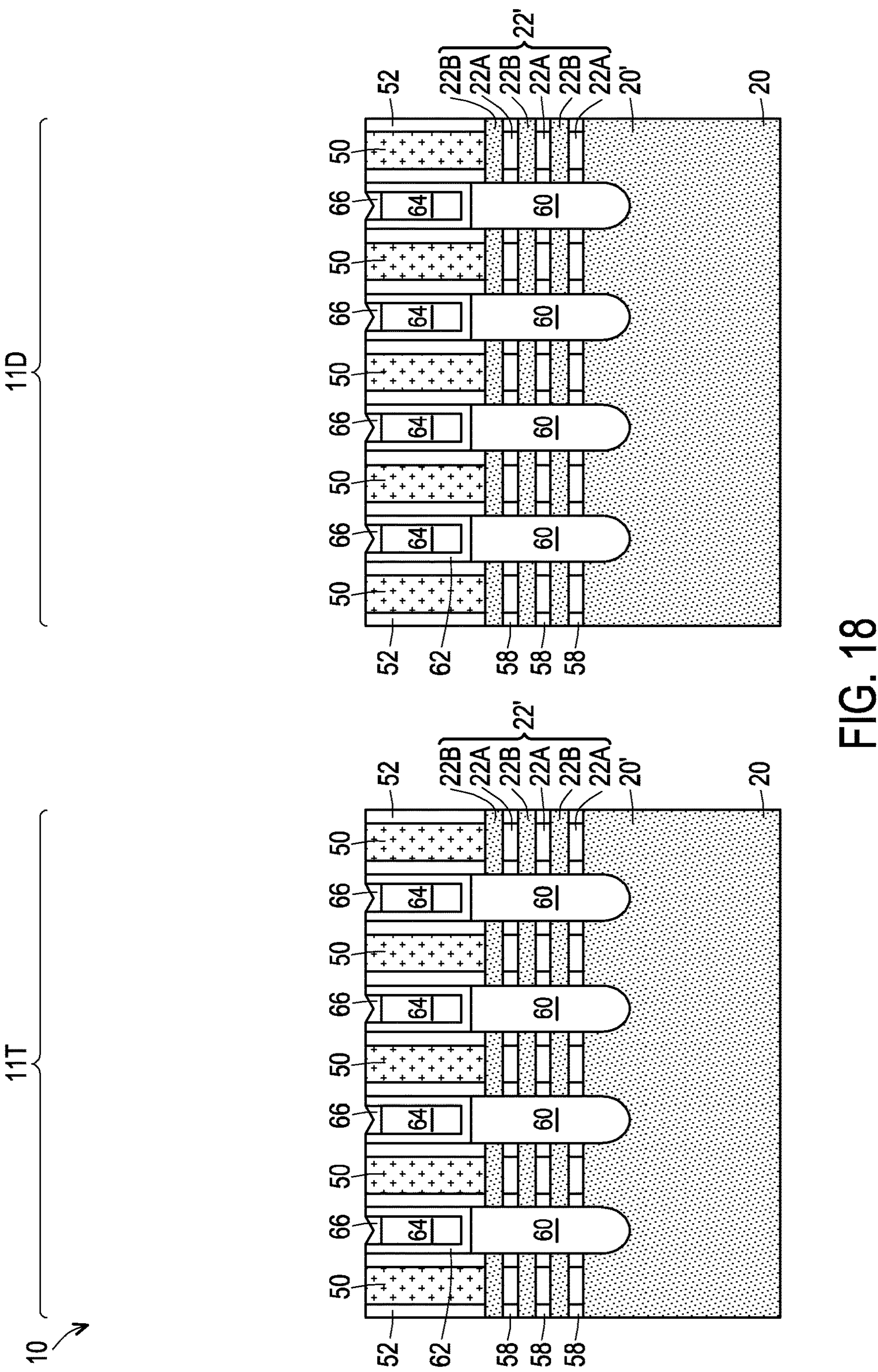
Figure 19:
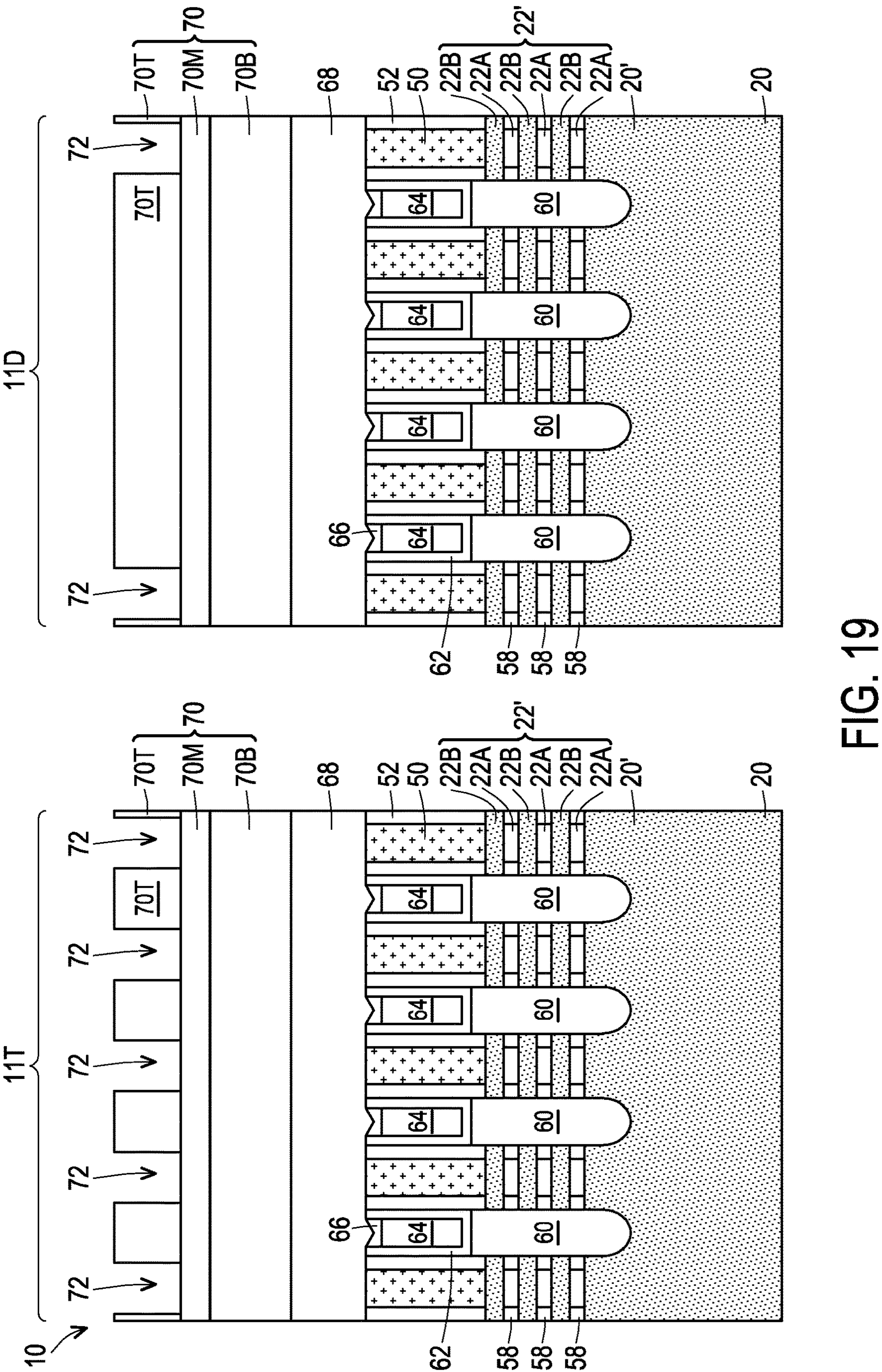
FIGS. 19, 20, 21, 22, 23, and 24 illustrate cross-sectional views of intermediate steps in the formation of isolation regions, in accordance with some embodiments.

FIGS. 17 and 18 illustrate views of the structure after the formation of Contact Etch Stop Layer (CESL) 62 and Inter-Layer Dielectric (ILD) 64. CESL 62 may be formed of silicon oxide, silicon nitride, silicon carbonitride, or the like, and may be formed using CVD, ALD, or the like. ILD 64 may include a dielectric material formed using, for example, FCVD, spin-on coating, CVD, or any other suitable deposition method. ILD 64 may be formed of an oxygen-containing dielectric material, which may include a silicon-oxide, Phospho-Silicate Glass (PSG), Boro-Silicate Glass (BSG), Boron-Doped Phospho-Silicate Glass (BPSG), Undoped Silicate Glass (USG), or the like. The formation of CESL 62 and ILD 64 include depositing a conformal CESL 62, depositing ILD 64, and performing a planarization process. In accordance with some embodiments, hard masks 66 are formed, and may be formed of or comprise silicon nitride, silicon oxynitride, silicon oxycarbide, or the like. The formation process may include recessing ILD 64 to form recesses, depositing the corresponding dielectric material into the recesses, and performing a planarization process.

FIGS. 18, 19, 20, and 21 illustrate the formation of fin isolation regions 84 (FIG. 21) in dummy gate stack 50 and the underlying isolation regions 86, which regions cut through and electrically isolate neighboring protruding fins. The isolation regions 84 may also be referred to as Cut-Poly on Diffusion Edge (CPODE) regions since the formation process involves the cutting of polysilicon dummy gate electrode on the edge of active regions. FIG. 18 illustrates the deposition of hard mask 68 and etching mask 70. In accordance with some embodiments, hard mask 68 is formed of or comprises silicon nitride, silicon oxynitride, or the like. In accordance with some embodiments, etching mask 70 is a tri-layer etching mask, which includes bottom layer 70B, middle layer 70M, and top layer 70T. Bottom layer 70B may be formed of a cross-linked photoresist. Middle layer 70B may be formed of an inorganic dielectric material. Top layer 70B is formed of a patterned photoresist, which has trenches 72 patterned therein.

Figure 20:
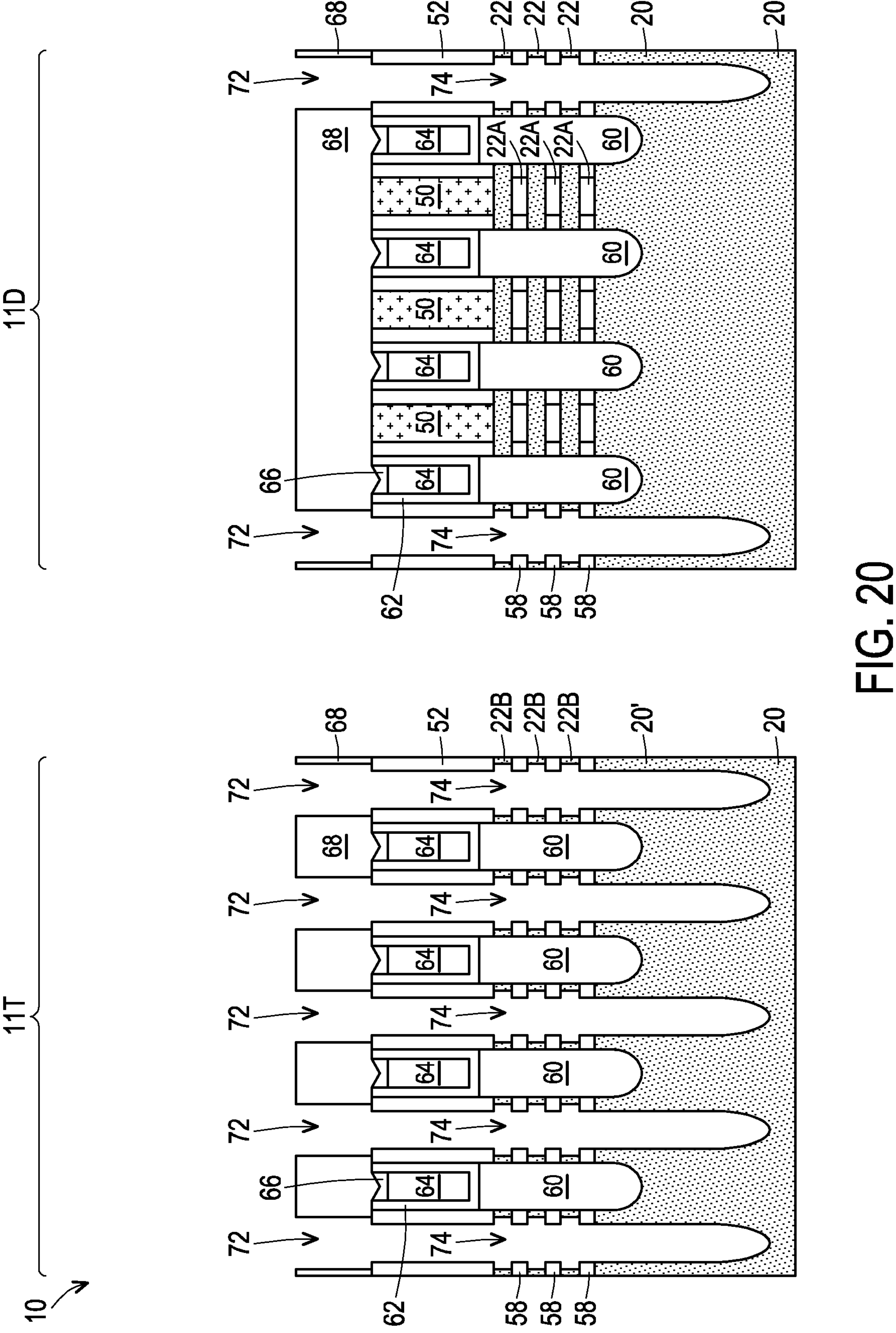

In FIG. 20, trenches 72 and 74 are etched, in accordance with some embodiments. As shown in FIG. 20, the etching of the trenches 72 and 74 removes first layers 22A between inner spacers 58 and removes second layers 22B. In some embodiments, top layer 70T (see FIG. 19) is used as an etching mask to etch middle layer 70M and bottom layer 70B. During the etching process, top layer 70T (and possibly middle layer 70M) may be consumed, leaving a patterned bottom layer 70B. In this manner, the trenches 72 may be transferred from top layer 70T to bottom layer 70B. The remaining etching mask 70 is then used to etch hard mask 68, such that trenches 72 are further transferred into hard mask 68. The remaining etching mask 70 is then removed, with the patterned hard mask 68 remaining. The patterned hard mask 68 is then used as an etching mask to etch the underlying structure to form trenches 72 and 74. First, gate stack 50 is etched, such that trench 72 further extends down into gate stack 50. The portion of trench 72 in gate stack 50 is also referred to a through-gate trench. The etching process is anisotropic, such that the trench 72 may have substantially vertical sidewalls. The etching of dummy gate electrode layer 46, when formed of polysilicon or amorphous silicon, may be performed using fluorine ($F_2$), Chlorine ($Cl_2$), hydrogen chloride (HCl), hydrogen bromide (HBr), Bromine ($Br_2$), $C_2F_6$, $CF_4$, $SO_2$, the like, or combinations thereof.

After the etching of the gate electrode 46, the dummy gate dielectric 44 and any native oxide formed on the surfaces of multilayer stacks 22' are removed through an etching process. The corresponding process may also be referred to as a dielectric break-through process. In accordance with some embodiments, the etching may be performed using $CF_4$, Ar, and/or the like, and the etching may have a low selectivity. After the dielectric-break through process, high-k dielectric regions 38 are revealed, and multilayer stacks 22' are also revealed to the trenches 72. Next, multilayer stacks 22' are etched and semiconductor strips 20' are etched. As shown in FIG. 20, the underlying bulk portion of substrate 20 underlying STI regions 30 are also etched. In accordance with some embodiments, the etching process includes a selective etch that has a high etching selectivity between semiconductor materials and dielectric materials. Accordingly, high-k dielectric regions 38, inner spacers 58, STI regions 30, etc., which are revealed in the etching process, are not etched. Trenches 74, which are also referred to as through-gate trenches, are thus formed. Trenches 74 may be considered part of trenches 72, in some cases.

In accordance with some embodiments, the etching of multilayer stacks 22', semiconductor strips 20', and the underlying bulk portion of substrate 20 are performed using HBr, $O_2$, and/or Ar. In the etching of semiconductor strips 20' and the underlying bulk portion of substrate 20, $CO_2$ may also be added in addition to $O_2$ or replacing $O_2$. The etching processes may also be performed using other etching gases such as $F_2$, $Cl_2$, HCl, HBr, $Br_2$, $C_2F_6$, $CF_4$, $SO_2$, $O_2$, $CH_2F_2$, the like, or combinations thereof. In some embodiments, the etching is performed using plasma etching, which may be performed with a bias power applied to achieve anisotropic etching.

Figure 21:
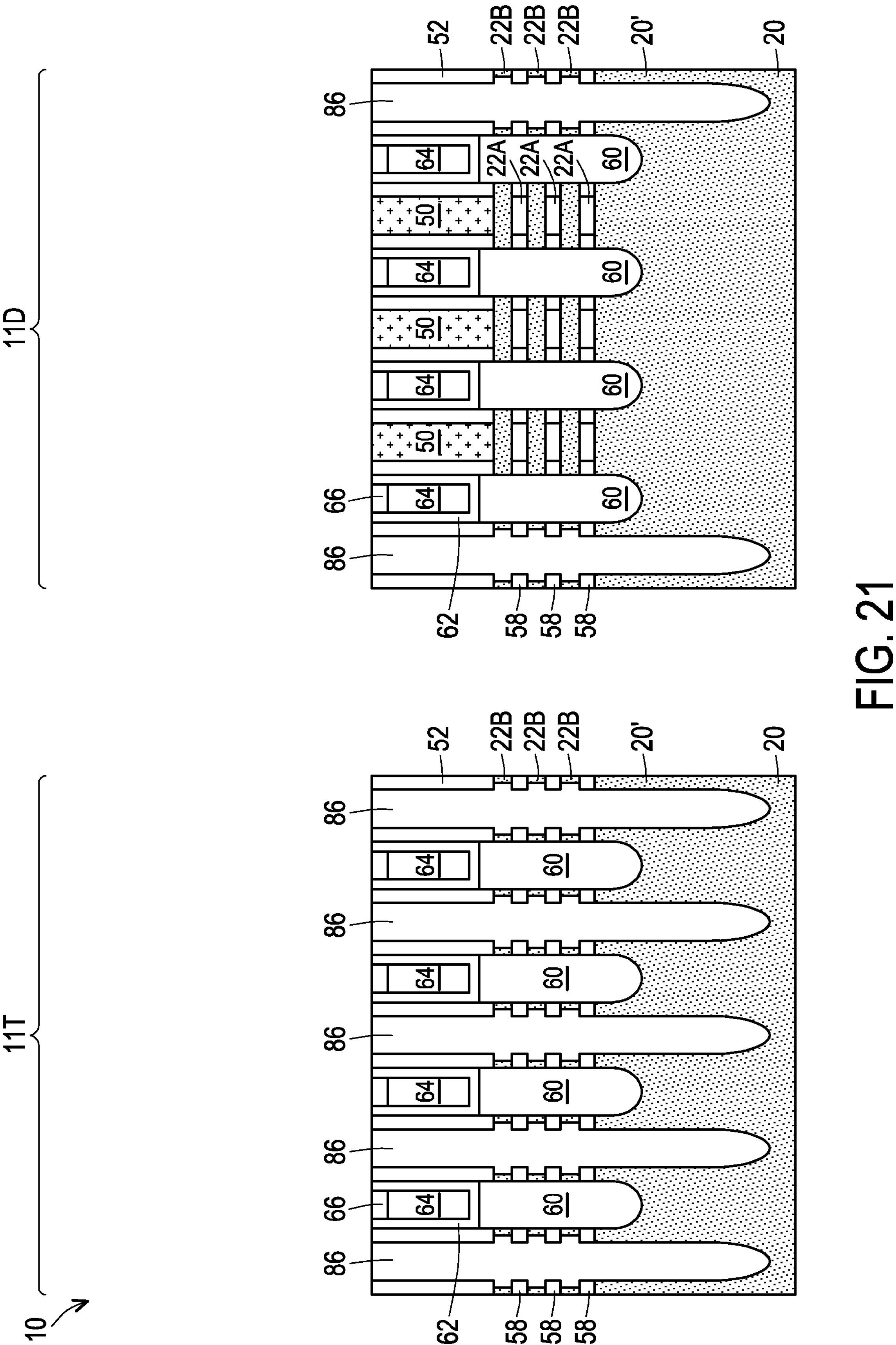

FIG. 21 illustrates a deposition process that fills trenches 72 and 74 and forms isolation regions 86, in accordance with some embodiments. The deposition process may deposit one or more dielectric layers within the trenches 72/74. In some embodiments, the dielectric layers include a dielectric liner and a dielectric fill layer (not separately illustrated). The dielectric liner may be formed of or comprise silicon oxide. The dielectric fill layer may be formed of or comprise silicon nitride. Other materials such as silicon carbide, silicon oxynitride, silicon carbonitride, silicon oxycarbonitride, or the like may also be used to form the dielectric layers. In some embodiments, a planarization process (e.g., a CMP process, grinding process, or the like) may be performed to remove excess dielectric layer material, with remaining portions of the dielectric layers forming the isolation regions 86. In some embodiments, the planarization process removes remaining portions of the hard mask 68.

In some cases, forming isolation regions 86 in the through via regions 11T allows the topology and composition of the through via regions 11T to be similar to those of the device regions 11D. This can allow for regions 11T and 11D to have more similar topography (e.g., more similar planarity), which can allow the device region 11D to be formed closer to the through via region 11T without increasing the risk of defects or negatively impacted device performance in the device region 11D. Additionally, as described previously, the formation of epitaxial source/drain regions 60 in both of the regions 11T and 11D can eliminate loading effects due to the formation of epitaxial source/drain regions 60 and also can reduce stresses caused by the presence of the subsequently-formed through-substrate via 110 (see FIG. 27). Additionally, isolation regions 86 and epitaxial source/drain regions 60 may be formed in the through via region 11T without additional process steps being required.

Figure 22:
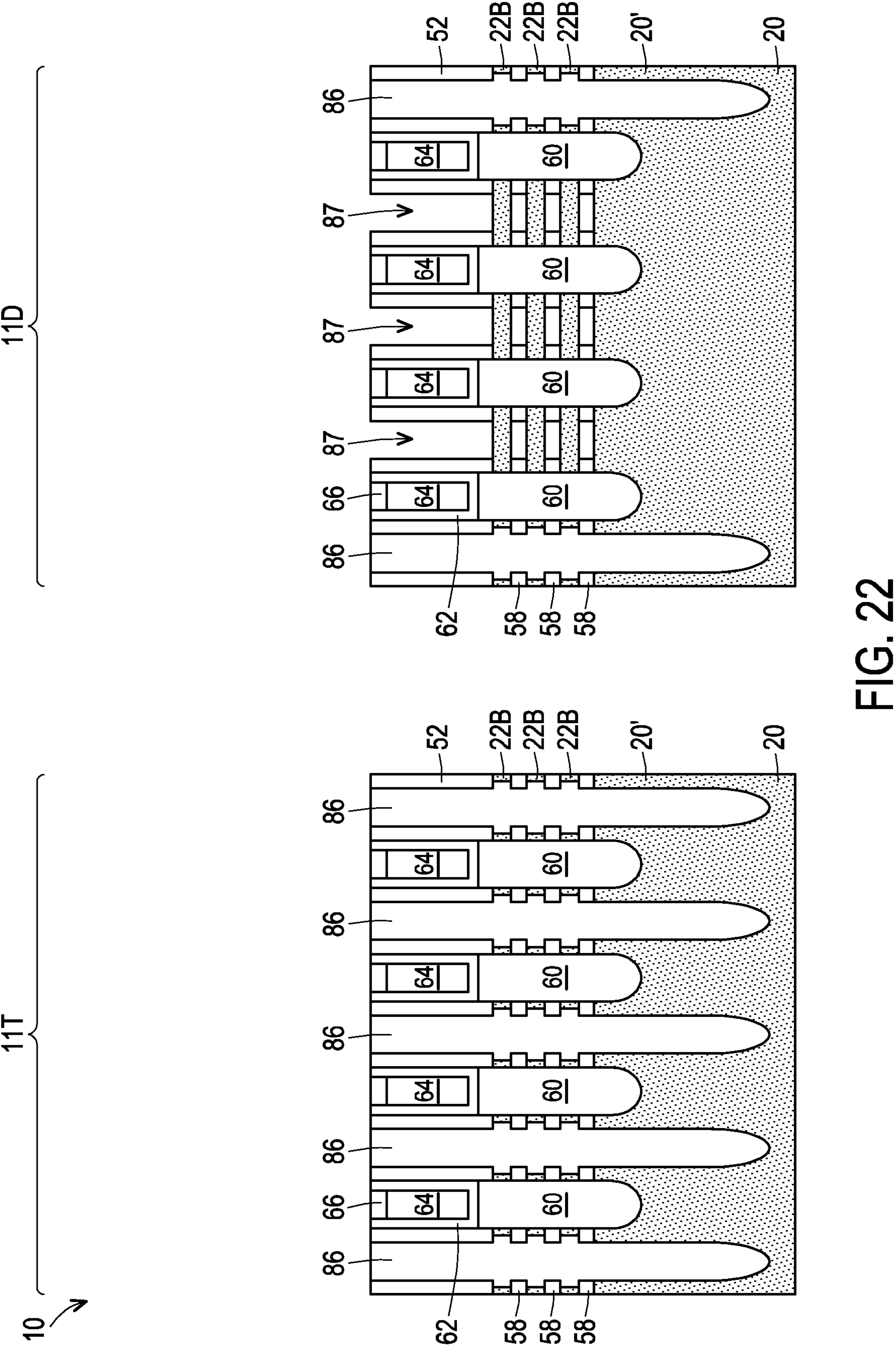

In FIG. 22, gate stacks 50 and sacrificial layers 22A in the device region 11D are removed, in accordance with some embodiments. In some embodiments, gate stacks 50 are removed by an anisotropic dry etch process that selectively etches the materials of the gate stacks 50. The sacrificial layers 22A may then be removed by performing an isotropic etching process such as wet etching or the like using etchants which are selective to the materials of the sacrificial layers 22A. The etching processes form recesses 87 that expose surfaces of the nanostructures 22B and which may surround the nanostructures 22B.

Figure 23:
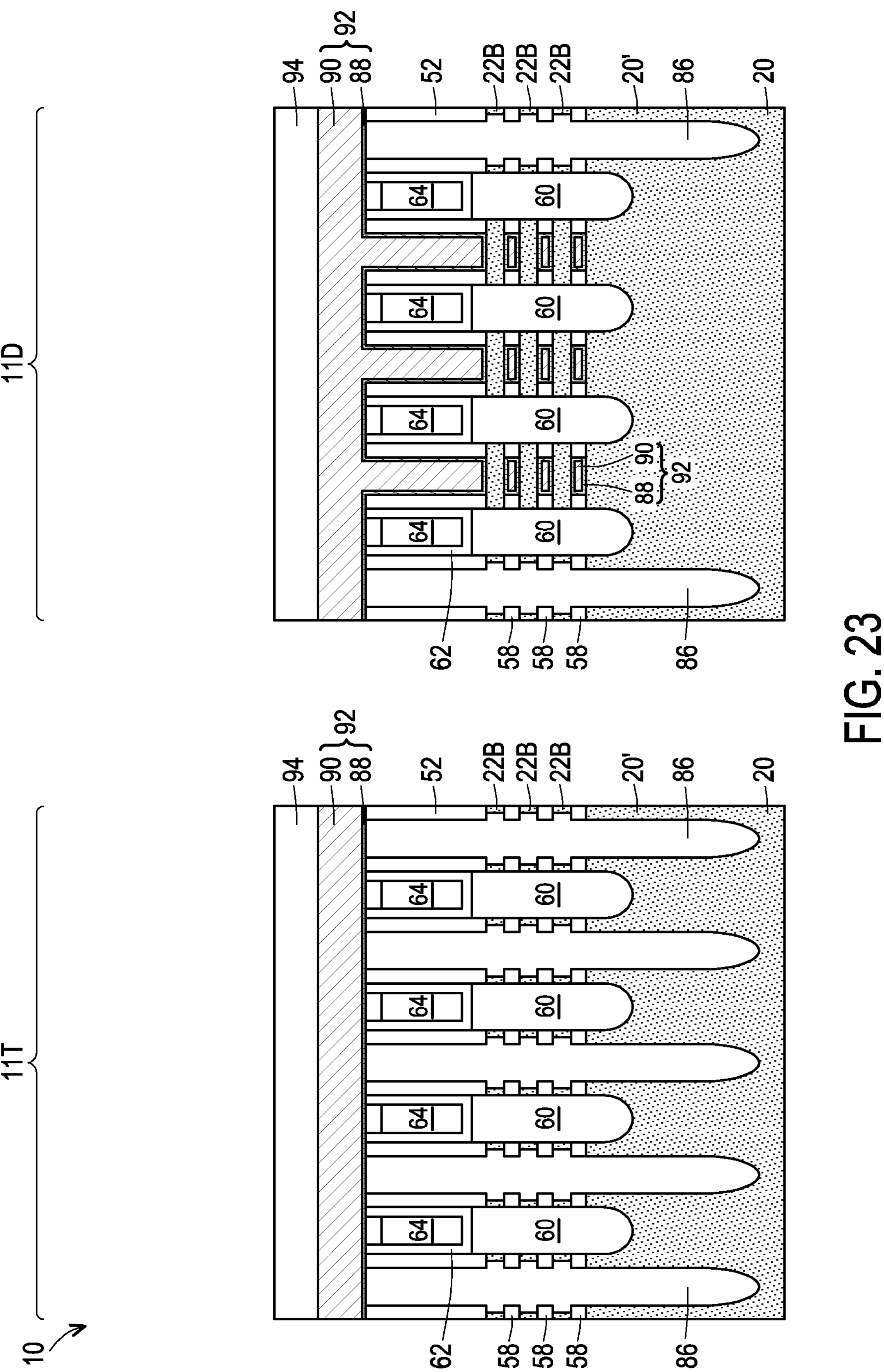

In FIG. 23, gate dielectrics 88 and gate electrodes 90 are formed for replacement gate stacks 92. The gate dielectrics 88 are deposited conformally in the recesses 87. In accordance with some embodiments, the gate dielectrics 88 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectrics 88 include a high-k dielectric material, and in these embodiments, the gate dielectrics 88 may have a k value greater than about 7.0, and may include a metal oxide or a silicate of hafnium, aluminum, zirconium, lanthanum, manganese, barium, titanium, lead, and combinations thereof. The formation methods of the gate dielectrics 88 may include molecular-beam deposition (MBD), ALD, PECVD, and the like.

The gate electrodes 90 are deposited over the gate dielectrics 88, respectively, and fill the remaining portions of the recesses 87. The gate electrodes 90 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 90 are illustrated in FIG. 23, the gate electrodes 90 may comprise any number of liner layers, any number of work function tuning layers, and a fill material. Any combination of the layers which make up the gate electrodes 90 may be deposited between adjacent ones of the nanostructures 22B. The gate dielectrics 88 and the gate electrodes 90 together may be considered replacement gate stacks 92 or replacement gate structures 92.

The replacement gate stacks 92 at least partially surround nanostructures 22B, and these nanostructures 22B act as the channel regions of the resulting NSFETs of the device region 11D. As shown in FIG. 23, the presence of the isolation regions 86 in the through via region 11T blocks the replacement gate stacks 92 from being formed on the nanostructures 22B. Similarly, the isolation regions 86 in the device region 11D blocks the replacement gate stacks 92 from being formed on some of the nanostructures 22B. A dielectric layer 94, which may include an etch stop layer, may be formed over replacement gate stacks 92.

Figure 24:
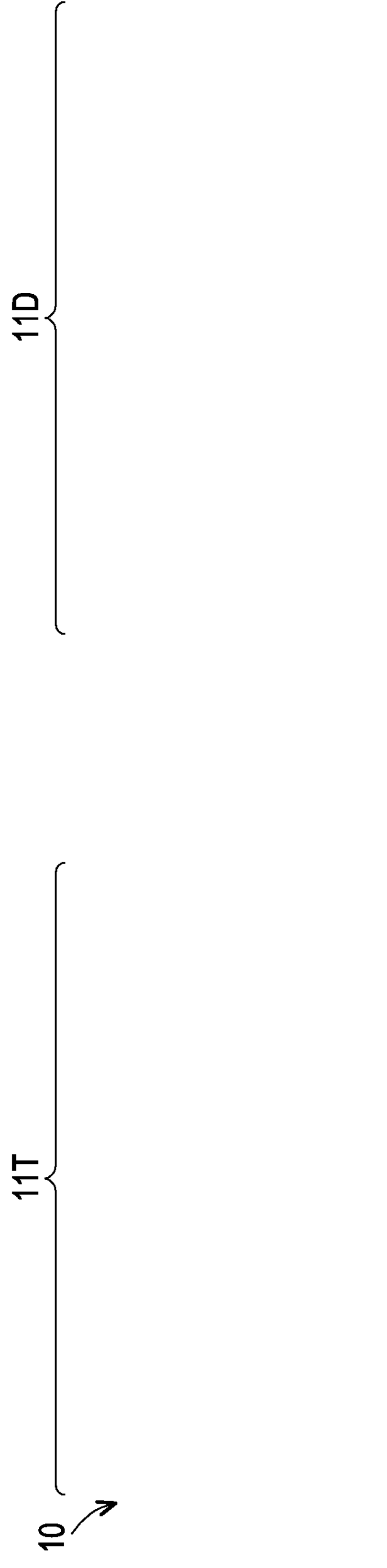
Figure 24:
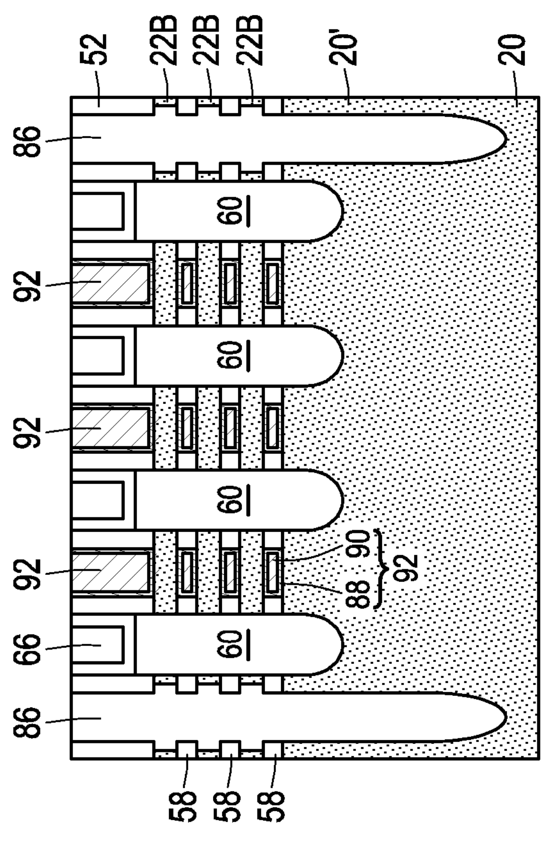
Figure 24:
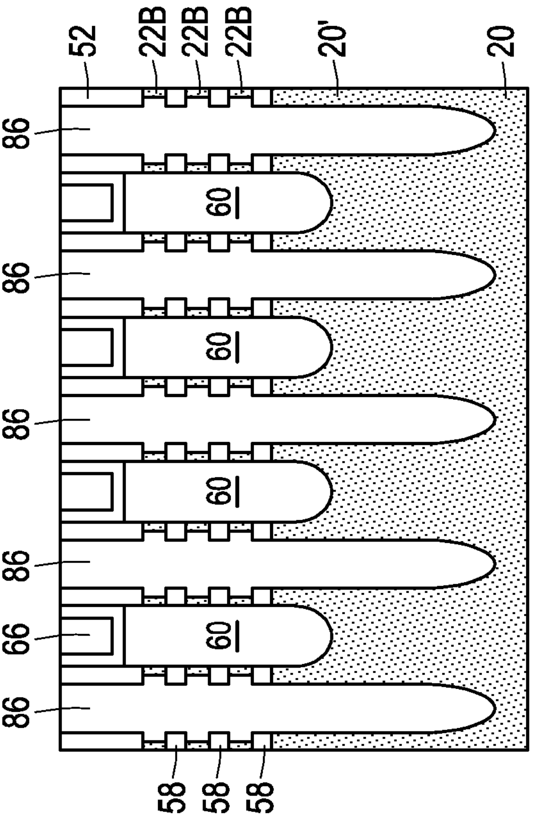

In FIG. 24, a planarization process is performed to remove excess material of the replacement gate stacks 90. The planarization process may include, for example, a CMP process, a grinding process, or the like. In some embodiments, the planarization process removes hard masks 66. In this manner, NSFETs may be formed in the device region 11D.

Figure 25:
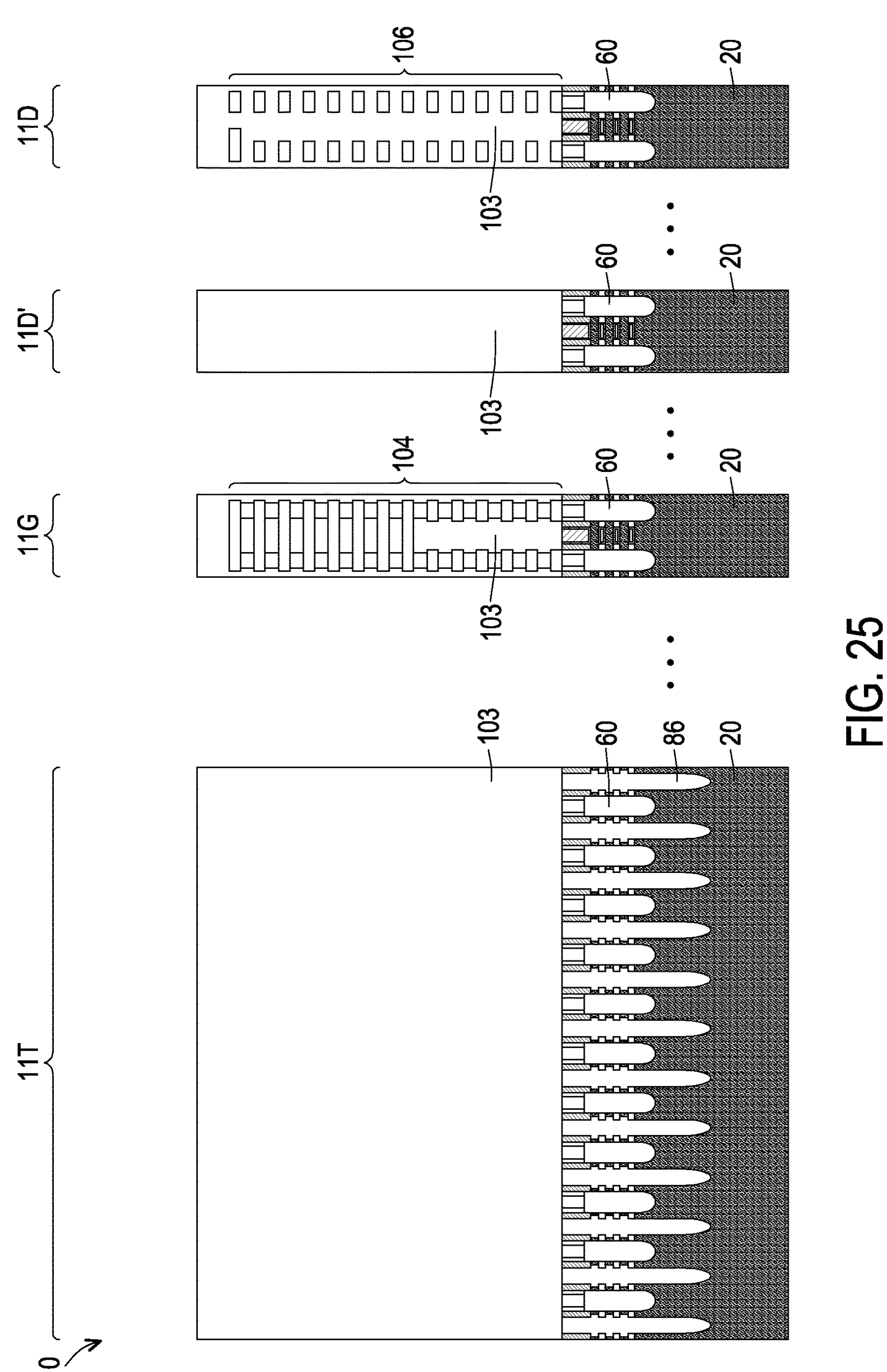
FIGS. 25, 26, 27, and 28 illustrate cross-sectional views of intermediate steps in the formation of a through-substrate via, in accordance with some embodiments.

In FIG. 25, intermetal dielectric (IMD) layers 103 are formed over the through via region 11T and device region 11D, and an interconnect structure 106 is formed in the IMD layers 103 of the device region 11D, in accordance with some embodiments. Further, a guard ring 104 is formed in the IMD layers 103 of a guard ring region 11G, which may be disposed between the through via region 11T and the device region 11D. The guard ring 104 and the interconnect structure 106 may comprise a plurality of metallization layers (not individually labeled) in a plurality of IMD layers 103 (not individually labeled). The metallization layers comprise conductive vias, contacts, and/or lines embedded in the IMD layers 103. The metallization layers may be formed using suitable techniques, such as using a damascene process, a dual damascene process, or the like. The guard ring 104 surrounds the through via region 11T and may block moisture or other contaminants from damaging the subsequently formed through-substrate via 110. The guard ring 104 shown is an example, and other configurations are possible. For example, the guard ring 104 may or may not be electrically coupled to NSFETs or other devices that may or may not be formed in the guard ring region 11G. The interconnect structure 106 interconnects the devices in the device region 11D (e.g., NSFETs and/or other devices) to form integrated circuits.

The guard ring 104, interconnect structure 106, and the metallization layers thereof shown in FIG. 25 are examples, and other configurations or arrangements are possible. In some cases, the guard ring 104 may be considered a dummy interconnect structure, and may be electrically isolated from the interconnect structure 106 and/or the subsequently formed through-substrate via 110. In some embodiments, a dummy region 11D' is disposed between the guard ring region 11G and the device region 11D. The dummy region 11D' may include dummy devices similar to the devices of the device region 11D, and may or may not include metallization layers. The dummy region 11D' may be formed to separate the device region 11D from the through-substrate via 110 (see FIG. 27), which can improve yield in the device region 11D. As shown in FIG. 25, in some embodiments, metallization layers are not formed in the IMD layers 103 of the through via region 11T.

Figure 26:
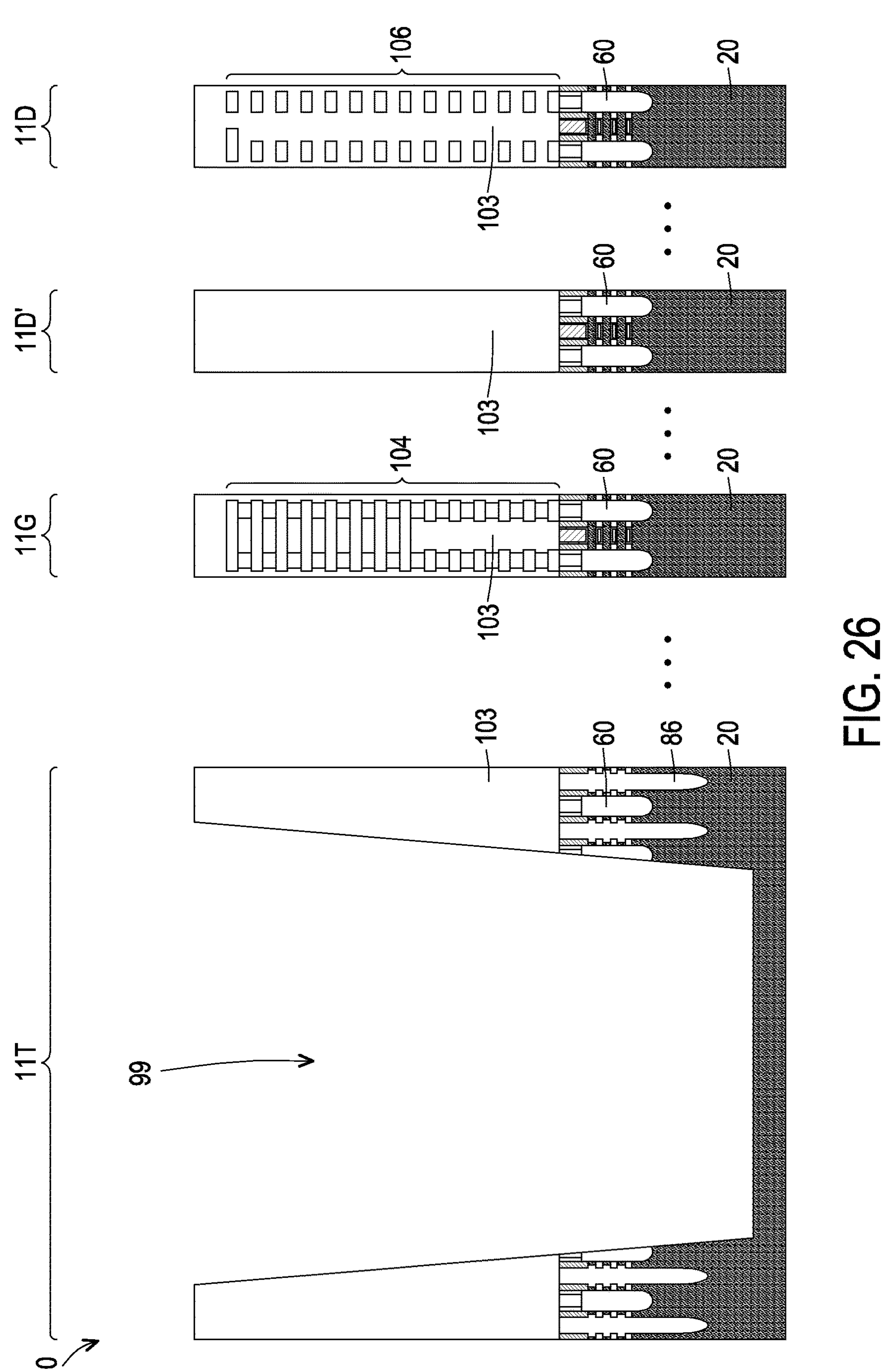

In FIG. 26, a recess 99 is formed in the through via region 11T. The recess 99 extends through the features formed in the through via region 11T, such as the epitaxial source/drain regions 60 and/or the isolation regions 86. As an example, the recess 99 may be formed by forming a patterned mask (not shown) over the IMD layers 103, with the pattern of the mask corresponding to the recess 99. One or more etching processes may be performed to extend the pattern of the patterned mask through the IMD layers 103 and into the substrate 20, forming the recess 99. Other techniques, such as milling, laser techniques, a combination thereof, and/or the like, may also be used. The recess 99 may be formed extending into the substrate 20 at least further than the isolation regions 86. In some embodiments, the recess 99 extends to a depth greater than the eventual desired thickness of the substrate 20. For example, in some embodiments, the back side of the substrate 20 may be thinned to expose the through-substrate via 110.

Figure 27:
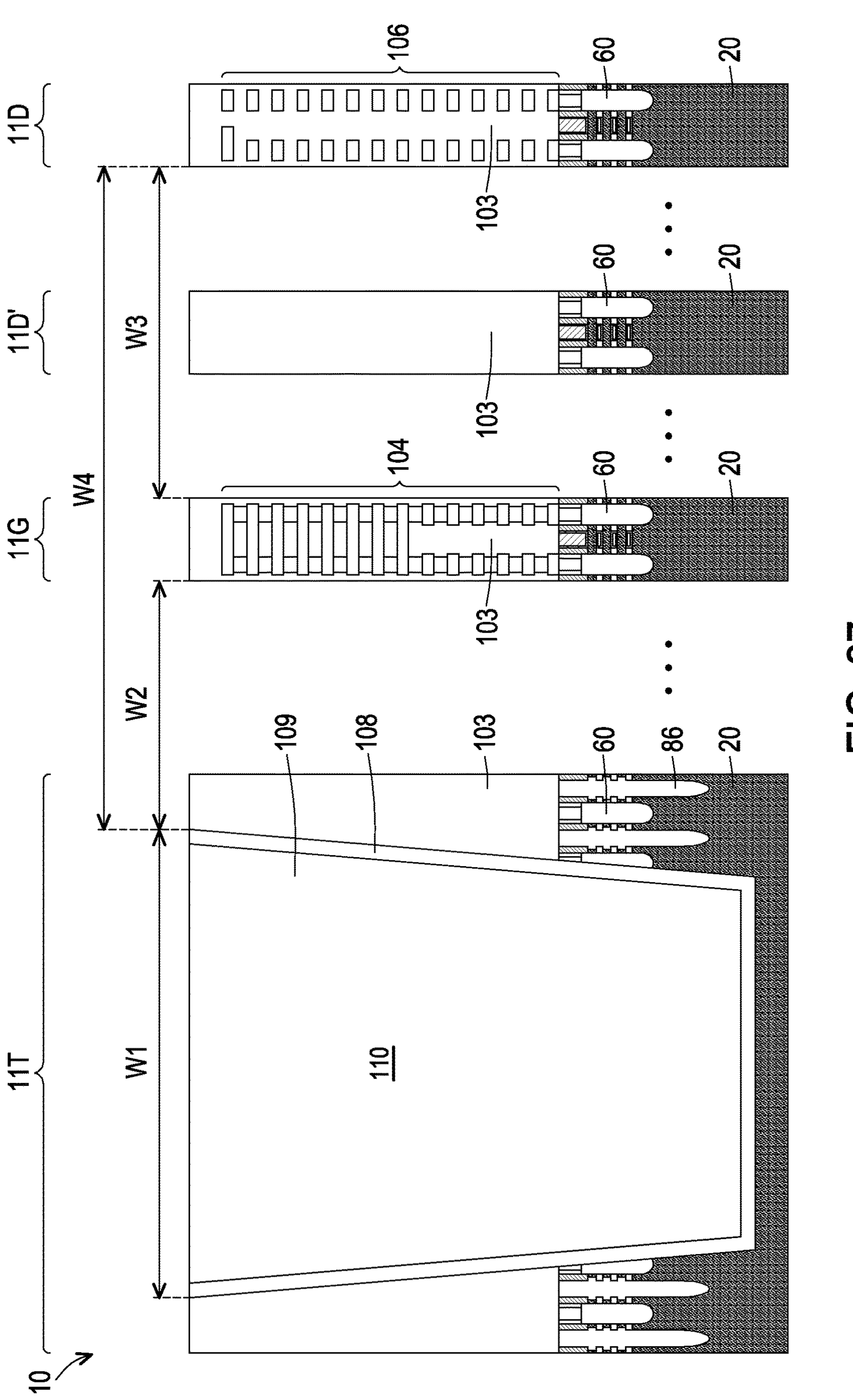

In FIG. 27, a liner 108 and a fill material 109 are deposited in the recess 99 to form the through-substrate via 110, in accordance with some embodiments. In some embodiments, liner 108 is formed of or comprises a dielectric material such as silicon nitride, silicon carbide, silicon oxynitride, silicon oxycarbide, or the like, or combinations thereof. The deposition method may include CVD, PECVD, Atomic Layer Deposition (ALD), Physical Vapor Deposition (PVD), or the like. In accordance with some embodiments, liner 108 has good ability for electrical isolation and diffusion prevention, and may prevent undesirable substances from penetrating through it. Liner 108 may be a single dielectric layer may comprise multiple dielectric layers. For example, dielectric liner 120 may include a silicon oxide liner, and a silicon nitride liner over the silicon oxide liner. In some embodiments, the liner 108 may include a barrier layer (not shown). The barrier layer may be formed from an oxide, a nitride, or an oxynitride, such as titanium nitride, titanium oxynitride, tantalum nitride, tantalum oxynitride, tungsten nitride, a combination thereof, and/or the like. The liner 108 may comprise other materials or layers in other embodiments.

After forming the liner 108, the fill material 109 may be deposited to fill the recess 99. The fill material 109 may comprise copper, tungsten, cobalt, aluminum, silver, gold, alloys, doped polysilicon, the like, or a combination thereof. In some embodiments, the fill material 109 may be formed by deposition or electroplating copper onto a seed layer (not shown), filling and overfilling the recess 99. However, any suitable process such as CVD, PVD, or the like may be used. Once the recess 99 has been filled, excess material outside of the recess 99 may be removed using a planarization process such as a CMP process or the like. Remaining portions of the liner 108 and fill material 109 form the through-substrate via 110.

In some embodiments, the through-substrate via 110 may have a width W1 in the range of about 0.5 μm to about 25 μm, though other widths are possible. In some embodiments, a distance W2 between the through-substrate via 110 and the guard ring 104 may be in the range of about 0.1 μm to about 1 μm, though other distances are possible. In some embodiments, a distance W3 between the guard ring 104 and the device region 11D may be in the range of about 0.1 μm to about 1 μm, though other distances are possible. In some embodiments, a distance W4 between the through-substrate via 110 and the device region 11D may be in the range of about 0.2 μm to about 2 μm, though other distances are possible. In some cases, the formation of isolation region 86 and/or epitaxial source/drain regions 60 in the through via region 11T may allow for the device region 11D to be formed closer to the through via region 11T without significantly increased risk of reduced yield or reduced device performance. In other words, embodiments described herein allow for smaller distances W2, W3, and/or W4. The smaller distances W2/W3/W4 may be due to improved topography and structural support provided by the presence of the isolation regions 86 and/or the epitaxial source/drain regions 60 in the through via region 11T.

Figure 28:
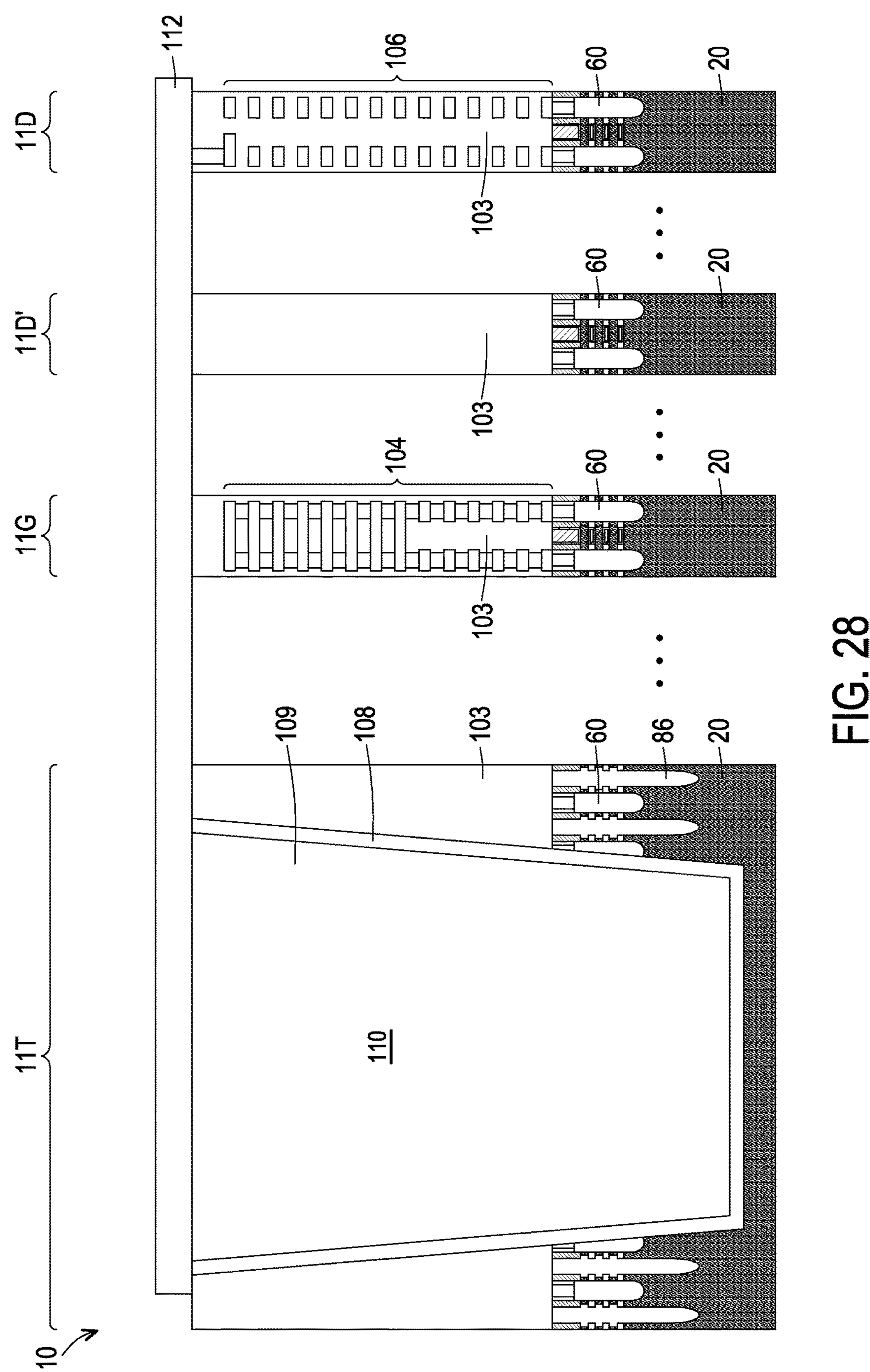

Additional processing may be performed on the structure shown in FIG. 27. For example, turning to FIG. 28, additional metallization layers, conductive layers, and/or redistribution layers may be formed over the through-substrate via 110 and the interconnect structure 106 to provide additional electrical interconnections. A representative conductive layer 112 is shown in FIG. 28 as a non-limiting example. As shown in FIG. 28, the conductive layer 112 is electrically coupled to the through-substrate via 110 and/or the interconnect structure 106. In some embodiments, the conductive layer 112 is formed over the guard ring 104 such that the conductive layer 112 is electrically isolated from the guard ring 104. Other conductive layers or configurations thereof are possible.

Figure 29:
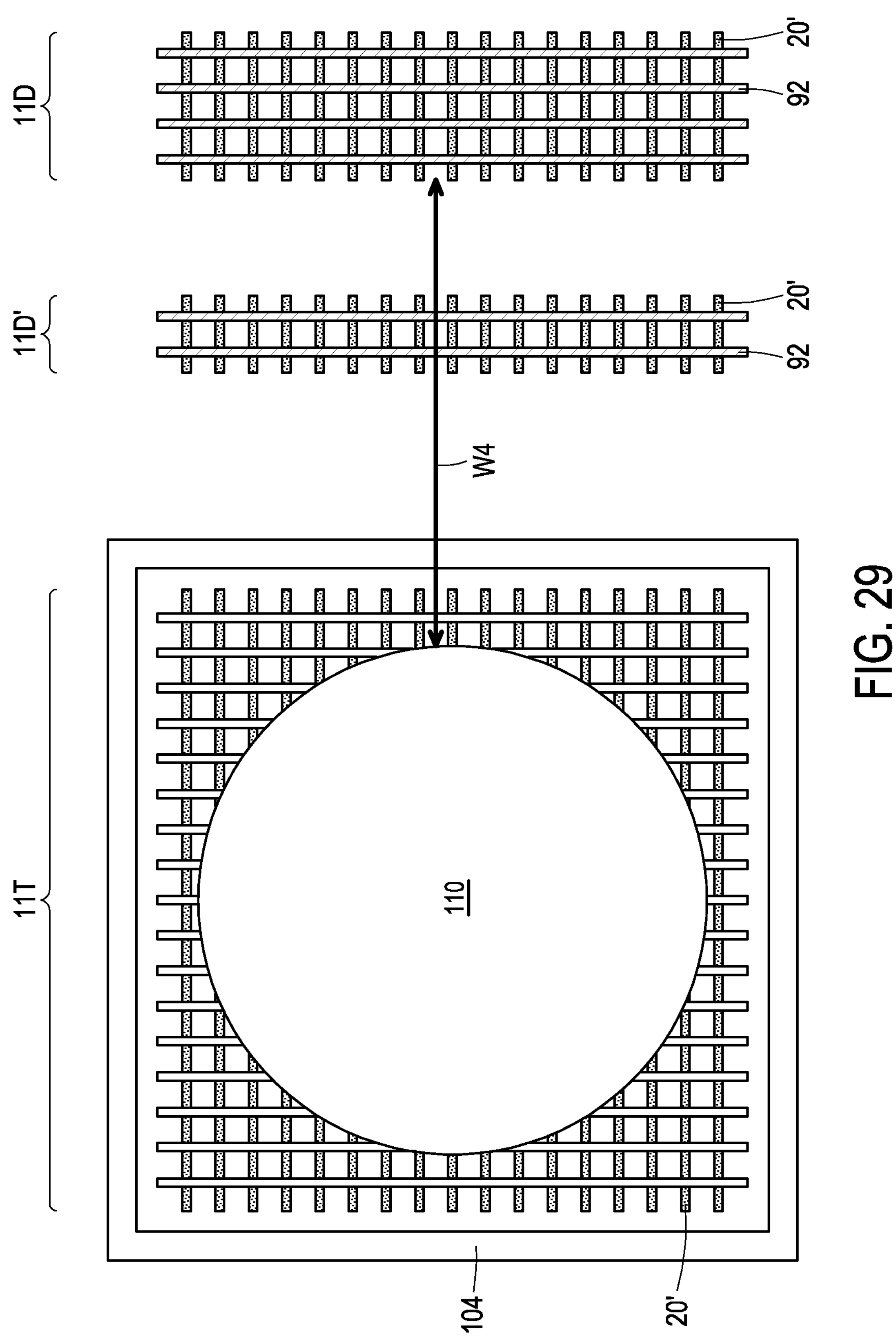
FIGS. 29, 30A, and 30B illustrate plan views of a through-substrate via, in accordance with some embodiments.

FIG. 29 illustrates a schematic plan view of a through-substrate via 110, in accordance with some embodiments. The plan view shown in FIG. 29 is an example, and other configurations or arrangements are possible. The through-substrate via 110 shown in FIG. 29 is similar to the through-substrate via 110 described previously. As shown in FIG. 29, the through-substrate-via 110 is formed in a through via region 11T that includes semiconductor strips 20' (e.g., fins 20') and isolation regions 86. The strips 20' and the isolation regions 86 may extend in orthogonal directions, in some embodiments. The through-substrate via 110 extends through the isolation regions 86, as described previously. The through via region 11T is surrounded (e.g., encircled) by the guard ring 104. In other embodiments, multiple guard rings 104 may be used. A dummy region 11D' separates a device region 11D from the guard ring 104. As shown in FIG. 29, replacement gate stacks 92 are formed in the dummy region 11D' and/or the device region 11D but not in the through via region 11T. In other embodiments, isolation regions 86 may also be formed in the dummy region 11D' and/or the device region 11D.

Figure 30A:
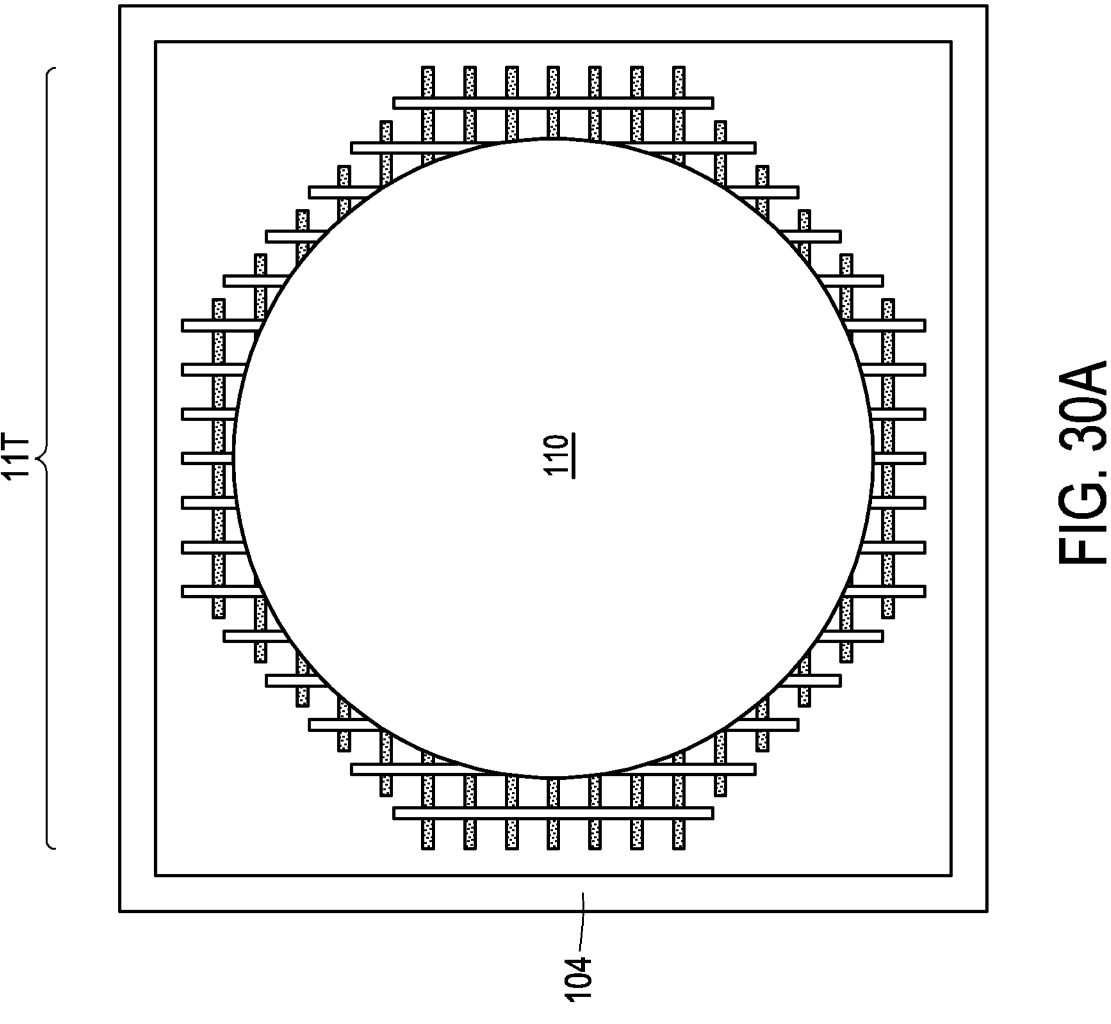
Figure 30B:
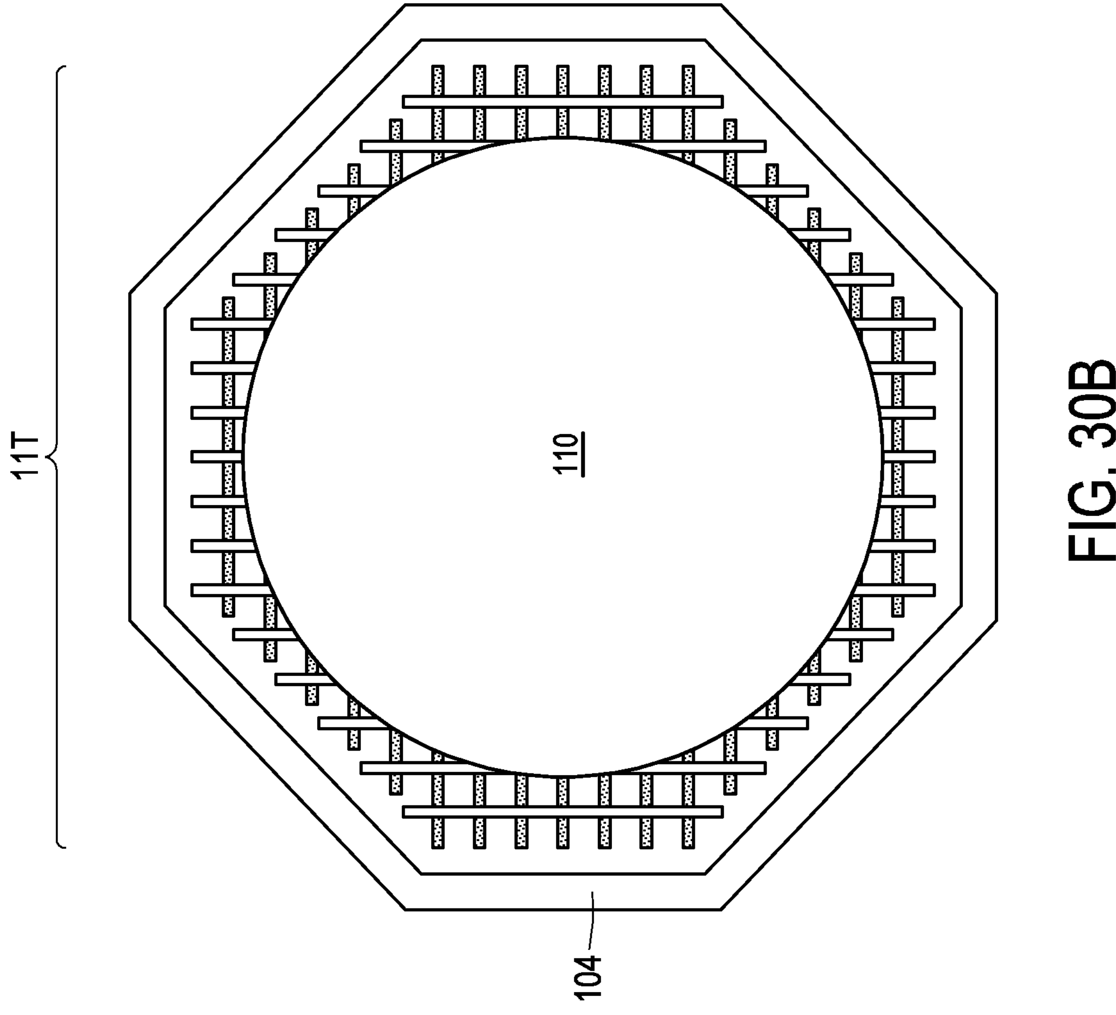

FIG. 29 shows a square-shaped through via region 11T surrounded by a square-shaped guard ring 104, but other shapes are possible. As non-limiting examples, FIGS. 30A and 30B show other configurations of through via regions 11T and guard rings 104. FIG. 30A illustrates a plan view of an octagonal through via region 11T surrounded by square-shaped guard ring 104, in accordance with some embodiments. FIG. 30B illustrates a plan view of an octagonal through via region 11T surrounded by an octagonal guard ring 104. Any suitable configurations or combinations thereof are possible.

Figure 31:
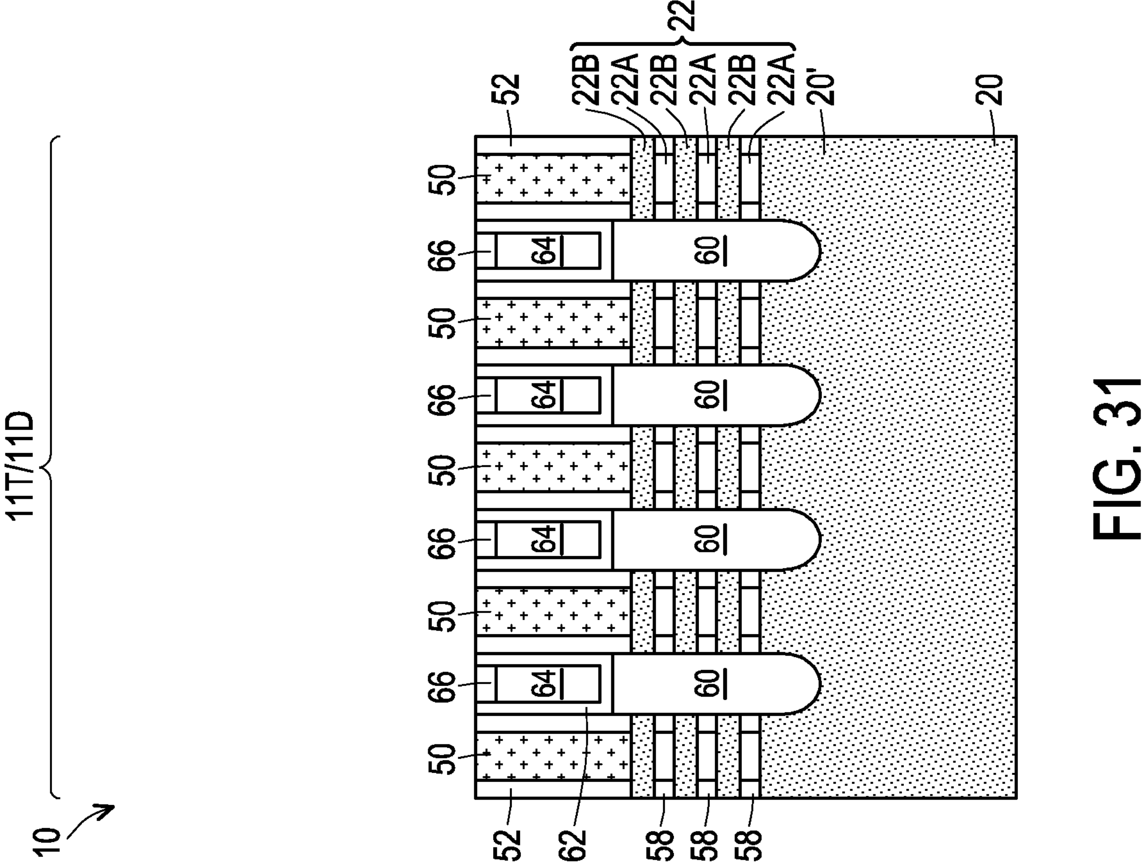
FIGS. 31, 32, 33, 34, and 35 illustrate cross-sectional views of intermediate steps in the formation of isolation regions, in accordance with some embodiments.
Figures 32, 33:
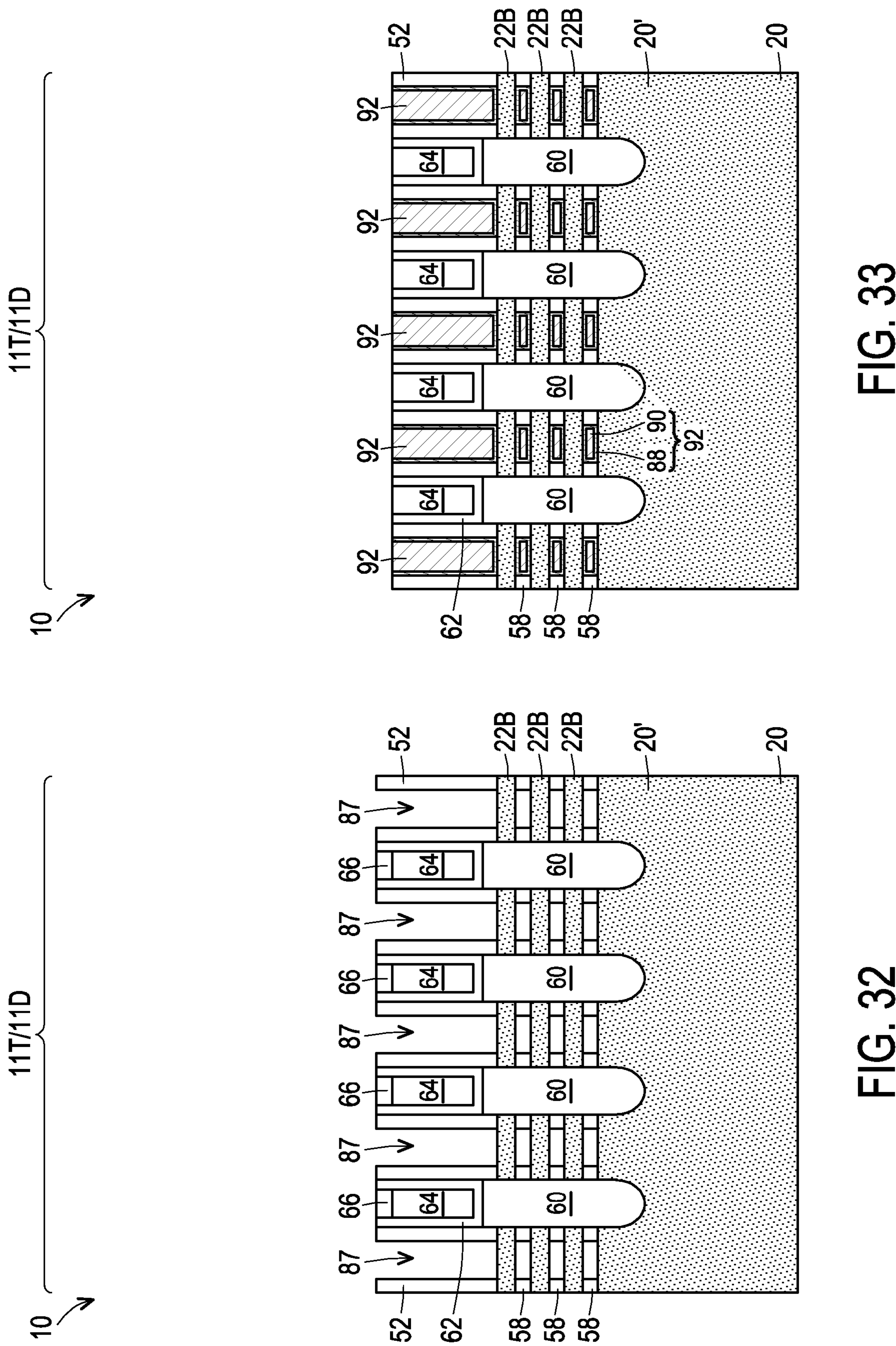

FIGS. 31 through 35 illustrate intermediate steps in the formation of isolation regions 86, in accordance with some embodiments. The process shown in FIGS. 31-35 is similar to the process described previously for FIGS. 18-24, except that the replacement gate stacks 92 are formed before the isolation regions 86 are formed. FIGS. 31-35 are cross-sectional views similar to those of FIGS. 18-24. FIGS. 31, 32, and 33 show cross-sectional views of a region that could be either a through via region 11T or a device region 11D, and FIGS. 34 and 35 each show cross-sectional views of a through via region 11T and a device region 11D.

FIG. 31 shows a cross-sectional view of a structure similar to that shown in FIGS. 17 and 18, which may be formed using a process similar to that described for FIGS. 1-18. For example, the structure of FIG. 31 includes epitaxial source/drain regions 60 and gate stacks 50 formed over multilayer stacks 22'.

In FIG. 32, one or more etching processes are performed to remove the gate stacks 50 and the first layers 22A, forming recesses 87. The etching processes and recesses 87 may be similar to those described previously for FIG. 22. For example, the gate stacks 50 and the first layers 22A may be selectively removed to form nanostructures 22B.

In FIG. 33, gate dielectrics 88 and gate electrodes 90 are deposited in the recesses to form replacement gate stacks 92, in accordance with some embodiments. The gate dielectrics 88 and gate electrodes 90 may be formed using materials or techniques similar to those described previously for FIG. 23. After depositing the materials of the gate dielectrics 88 and the gate electrodes 90, a planarization process may be performed, similar to the process described for FIG. 24. In some cases, the structure shown in FIG. 33 may be similar to the structure of the device region 11D shown in FIG. 24.

Figure 34:
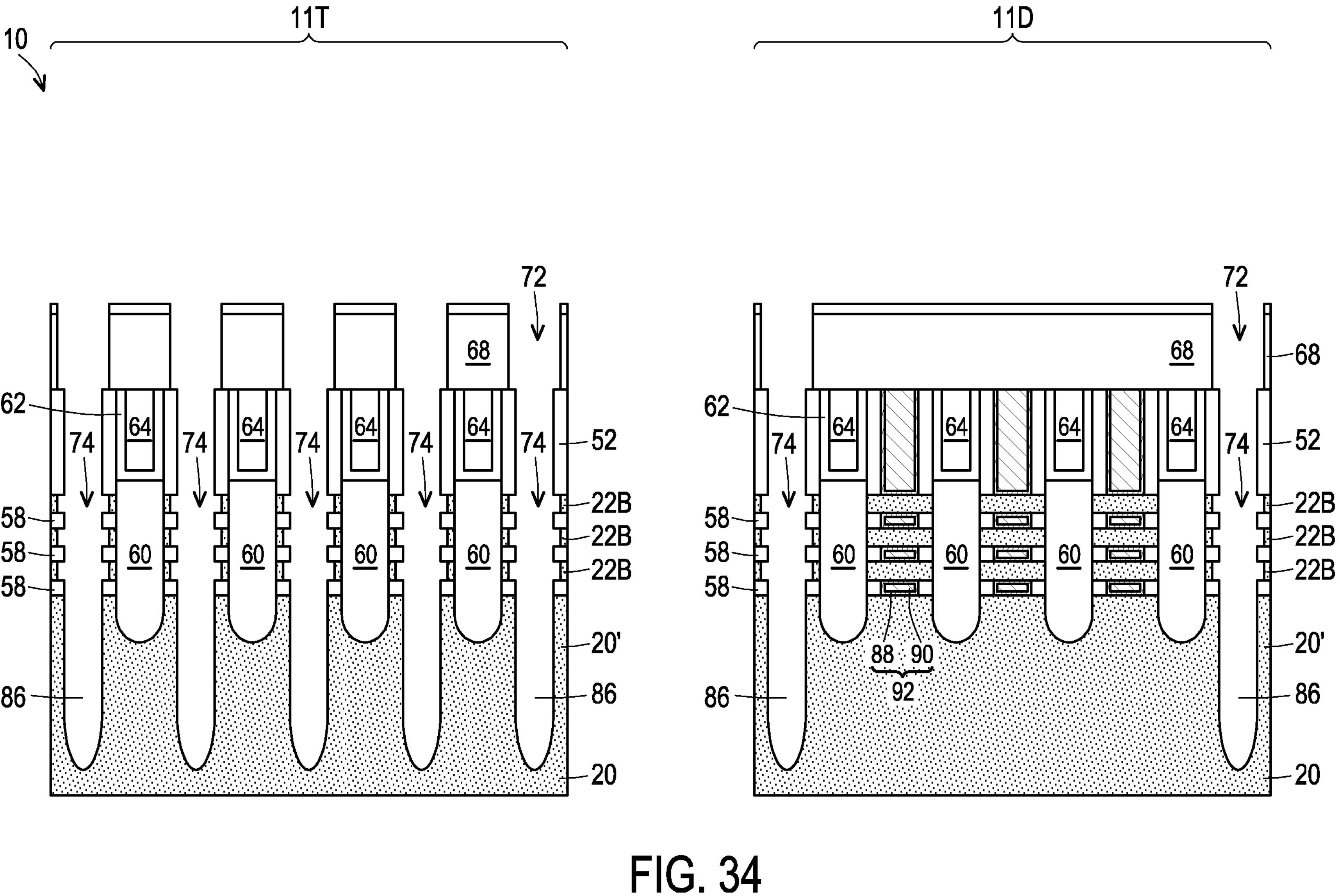

In FIG. 34, a hard mask 68 is formed over the structure and trenches 72/74 are etched, in accordance with some embodiments. The hard mask 68 may be formed over the through via region 11T and the device region 11D and patterned, similar to the steps described for FIGS. 19-20. One or more etching processes may then be performed to form trenches 72 and 74, which may be similar to the step described for FIG. 20. For example, the etching process(es) remove the gate stacks 50 and the multilayer stacks 22' in the through via region 50T.

Figure 35:
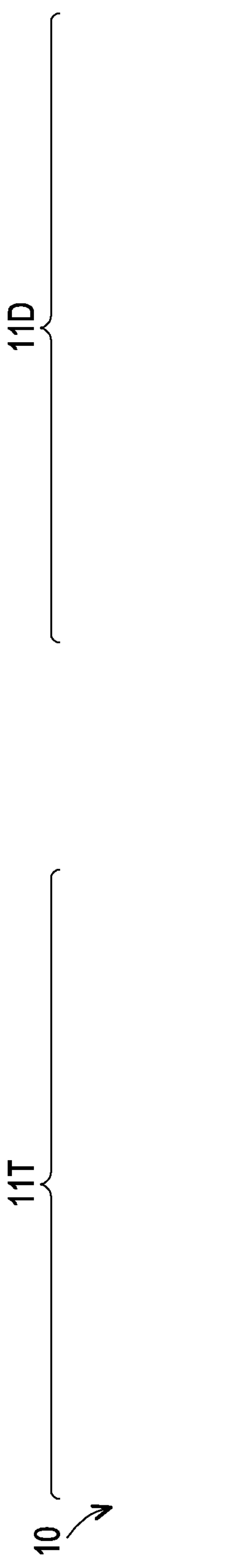
Figure 35:
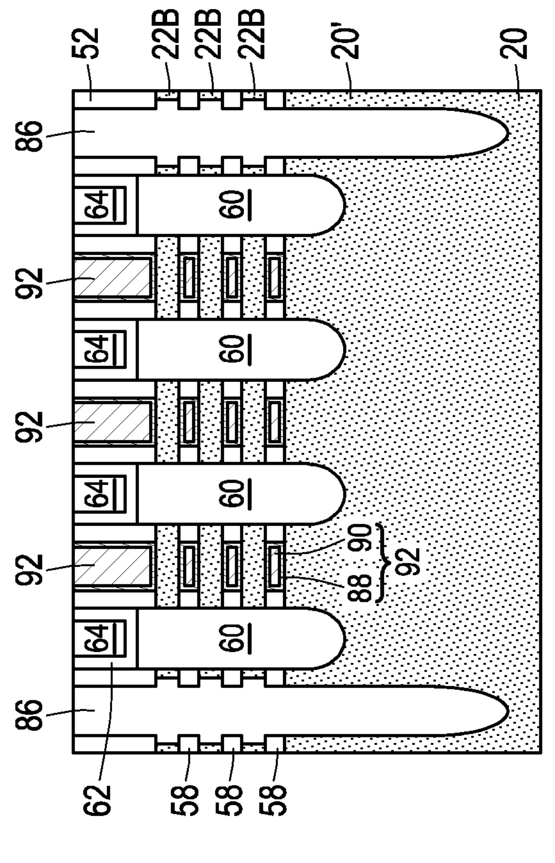
Figure 35:
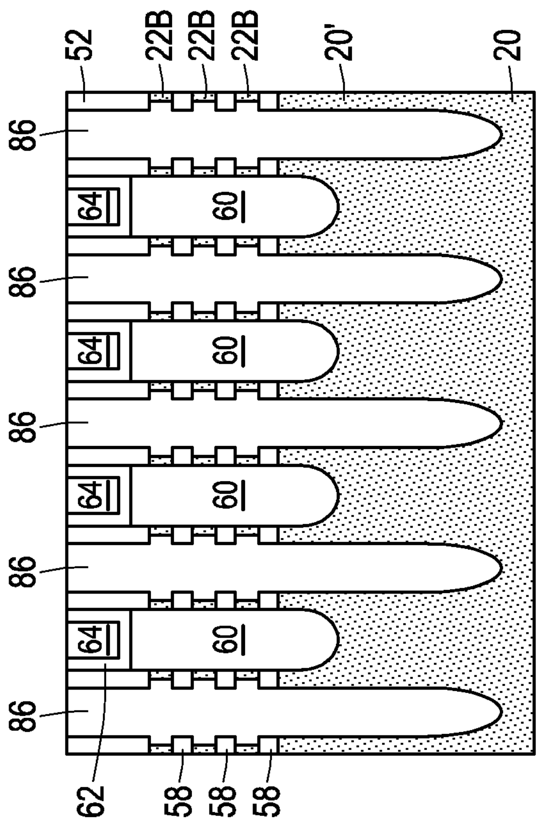

In FIG. 35, a deposition process is performed to fill trenches 72 and 74 and form isolation regions 86, in accordance with some embodiments. The deposition process may be similar to that described previously for FIG. 21. For example, the deposition process may deposit one or more dielectric layers within the trenches 72/74. A planarization process, such as a CMP process or the like, make be performed to remove excess dielectric layer material.

Figure 36A:
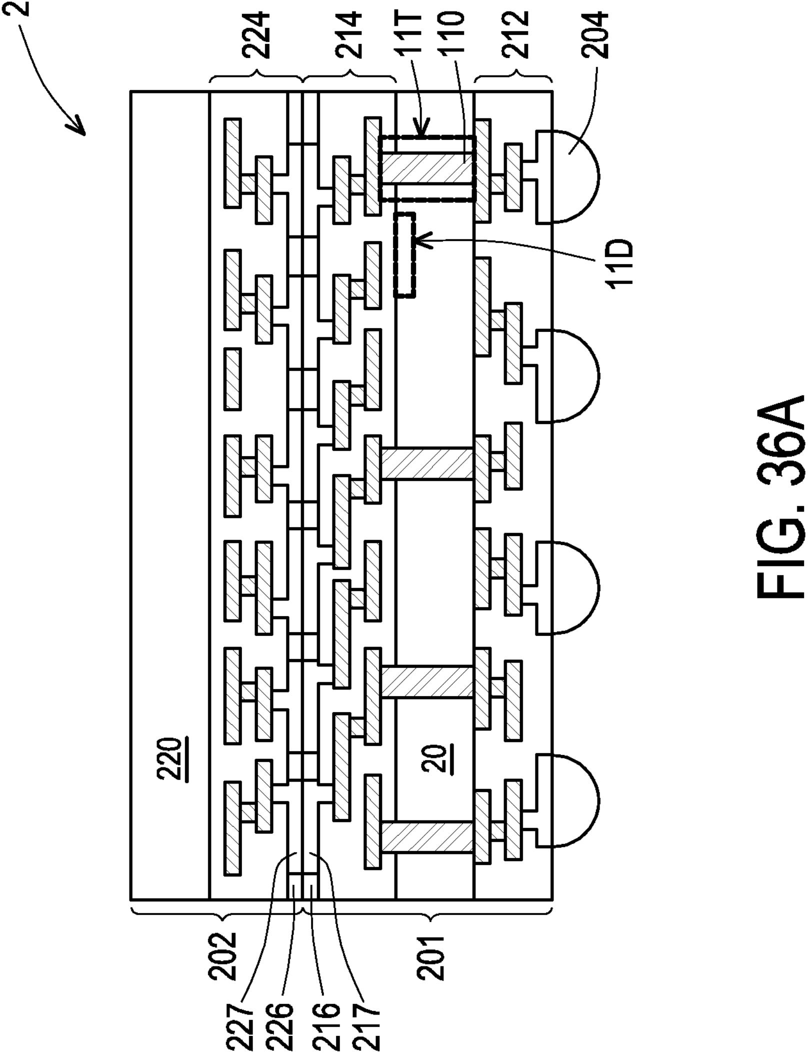
FIGS. 36A, 36B, and 36C illustrate packages, in accordance with some embodiments.
Figure 36B:
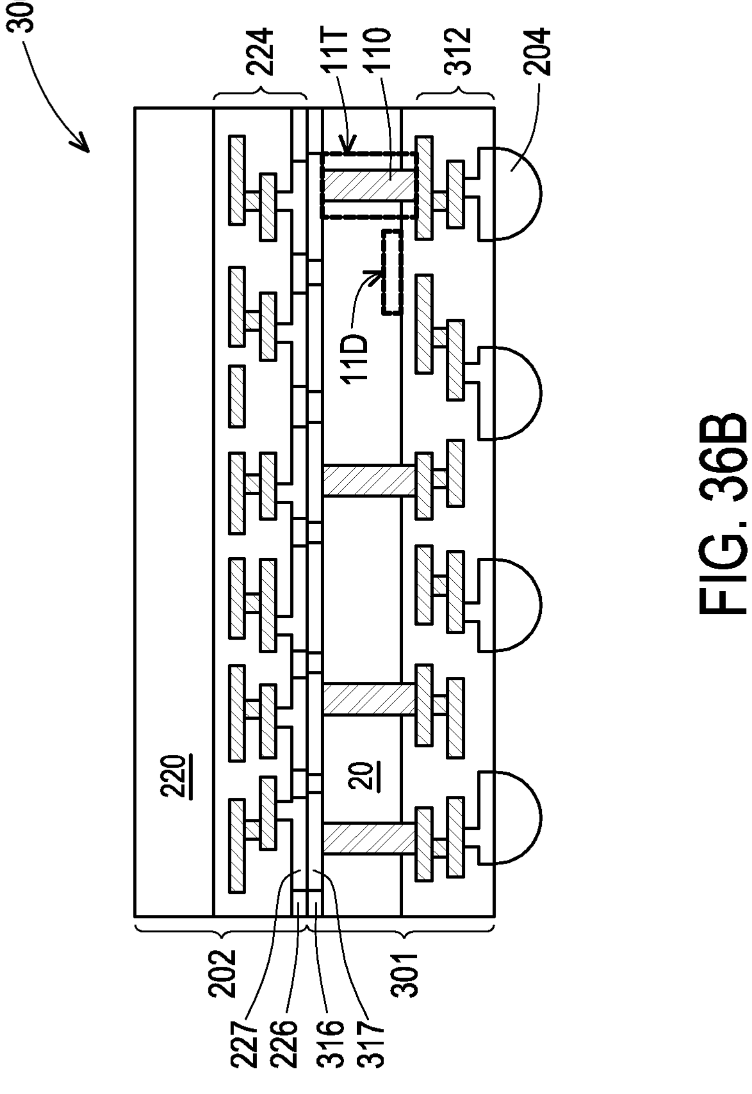
Figure 36C:
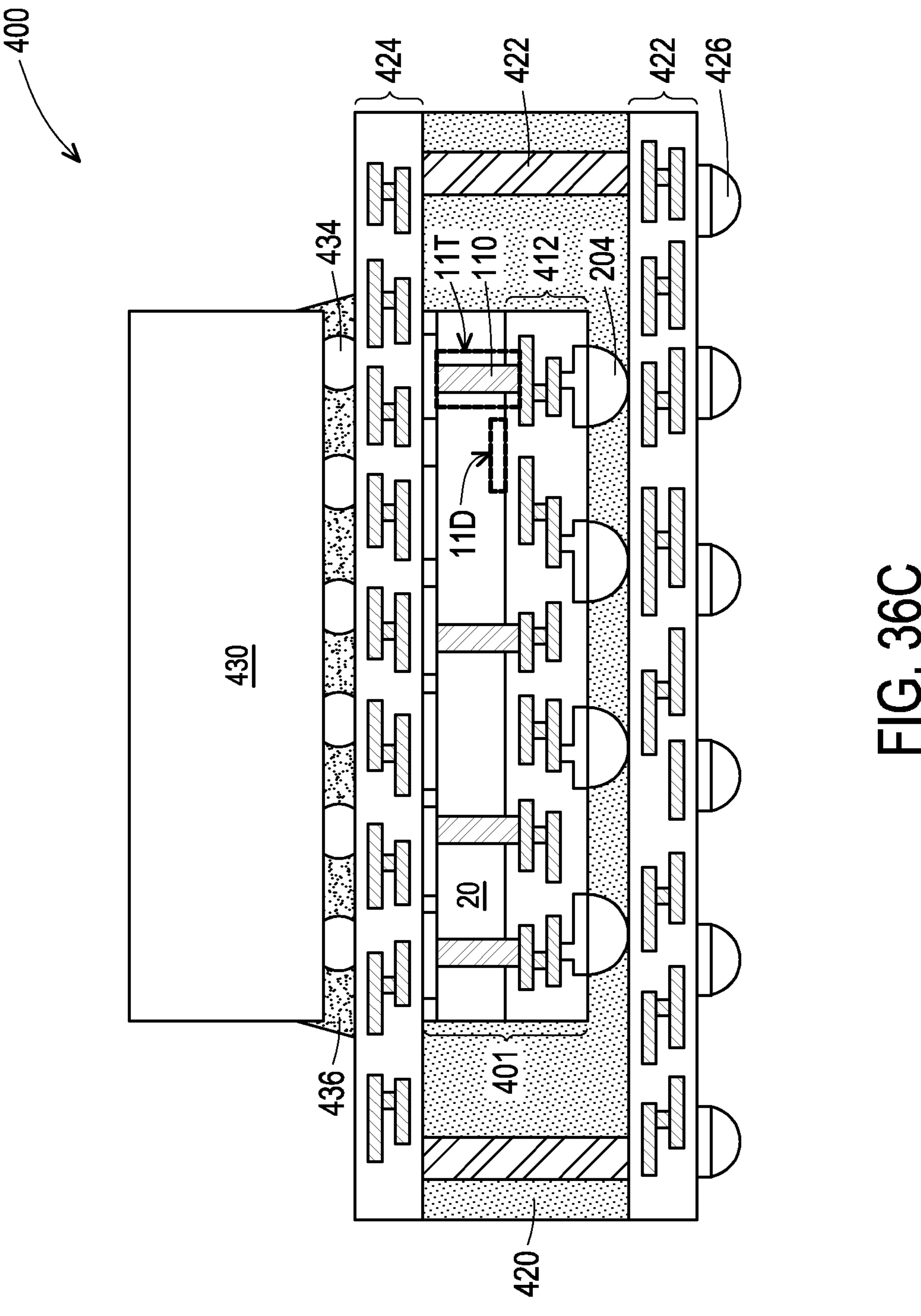

FIGS. 36A, 36B, and 36C illustrate example packages 200, 300, and 400 that comprise some of the techniques described herein, in accordance with some embodiments. The packages 200, 300, and 400 shown in FIGS. 36A-36C are non-limiting examples presented for illustrative purposes, and other packages are possible. For clarity and simplicity, some similar features in the packages 200, 300, and 400 are given the same reference number, and some features in the packages 200, 300 and 400 are given the same reference number as similar features described previously. For example, packages 200, 300, and 400 include substrates 20, through substrate vias 110, through via regions 11T, and device regions 11D which may be similar to those described previously. However, these features may be different than those described previously in some cases. In some cases, details of similar features are not repeated.

FIG. 36A illustrates a package 200, in accordance with some embodiments. The package 200 includes a first package component 201 bonded to a second package component 202, and in some cases the package 200 may be considered a System on Integrated Circuit (SoIC) or the like. The first package component 201 and/or the second package component 202 may comprise dies, chips, interposers, wafers, or the like.

In some embodiments, the first package component 201 comprises a substrate 20 with one or more through substrate vias 110 formed therein. The through substrate vias 110 may be similar to the through substrate vias 110 described previously (e.g., in FIG. 27) and may be formed using similar techniques. For example, the through substrate vias 110 may be formed in a through via region 11T that is separated from a device region 11D. The device region 11D may be similar to the device regions 11D described previously. For example, devices such as nanostructure field effect transistors (NSFETs), fin field effect transistors (FinFETs), or the like may be formed in the device region 11D at a front side of the substrate 20. In the embodiment shown in FIG. 36A, the first package component 201 also includes an interconnect structure 212 on the back side of the substrate 20 and an interconnect structure 214 on the front side of the substrate 20. The interconnect structures 212 and 214 may be electrically connected by the through substrate vias 110. In some embodiments, conductive connectors 204 may be formed on the interconnect structure 212, which may be solder bumps, conductive pillars, or the like.

In some embodiments, the second package component 202 comprises a substrate 220 with an interconnect structure 224 formed thereon. In some embodiments, a bonding layer 216 of the first package component 201 is directly bonded to a bonding layer 226 of the second package component 202. For example, the bonding layer 216 and the bonding layer 226 may be bonded using dielectric-to-dielectric bonding. Metal pads 217 formed in the bonding layer 216 may also be directly bonded to metal pads 227 formed in the bonding layer 226 using metal-to-metal bonding. In this manner, the second package component 202 may physically and electrically contact the first package component 201 to form a package 200.

FIG. 36B illustrates a package 300, in accordance with some embodiments. The package 300 includes a first package component 301 bonded to a second package component 202, and in some cases the package 300 may be considered a System on Integrated Circuit (SoIC) or the like. The first package component 301 and/or the second package component 202 may comprise dies, chips, interposers, wafers, or the like.

In some embodiments, the first package component 301 comprises a substrate 20 with one or more through substrate vias 110 formed therein. The through substrate vias 110 may be similar to the through substrate vias 110 described previously (e.g., in FIG. 27) and may be formed using similar techniques. For example, the through substrate vias 110 may be formed in a through via region 11T that is separated from a device region 11D. The device region 11D may be similar to the device regions 11D described previously. For example, devices NSFETs, FinFETs, or the like may be formed in the device region 11D at a front side of the substrate 20. In the embodiment shown in FIG. 36B, the first package component 301 also includes an interconnect structure 312 on the front side of the substrate 20 and metal pads 317 formed in a bonding layer 316 on the back side of the substrate 20. The interconnect structure 312 and the metal pads 317 may be electrically connected by the through substrate vias 110. In some embodiments, conductive connectors 204 may be formed on the interconnect structure 312, which may be solder bumps, conductive pillars, or the like.

In some embodiments, the second package component 202 comprises a substrate 220 with an interconnect structure 224 formed thereon. In some embodiments, the bonding layer 316 of the first package component 301 is directly bonded to a bonding layer 226 of the second package component 202. For example, the bonding layer 316 and the bonding layer 226 may be bonded using dielectric-to-dielectric bonding. Metal pads 317 formed in the bonding layer 316 may also be directly bonded to metal pads 227 formed in the bonding layer 226 using metal-to-metal bonding. In this manner, the second package component 202 may physically and electrically contact the first package component 301 to form a package 300.

FIG. 36C illustrates a package 400, in accordance with some embodiments. The package 400 includes a package component 401 and a die 430, and in some cases the package 400 may be considered an Integrated Fan-Out (InFO) package or the like. The package component 401 and/or the die 430 may comprise dies, chips, interposers, wafers, or the like.

In some embodiments, the package component 401 comprises a substrate 20 with one or more through substrate vias 110 formed therein. The through substrate vias 110 may be similar to the through substrate vias 110 described previously (e.g., in FIG. 27) and may be formed using similar techniques. For example, the through substrate vias 110 may be formed in a through via region 11T that is separated from a device region 11D. The device region 11D may be similar to the device regions 11D described previously. For example, devices NSFETs, FinFETs, or the like may be formed in the device region 11D at a front side of the substrate 20. In the embodiment shown in FIG. 36C, the package component 401 also includes an interconnect structure 412 on the front side of the substrate 20 and metal pads (not labeled) formed on the back side of the substrate 20. The interconnect structure 412 and the metal pads 317 may be electrically connected by the through substrate vias 110. In some embodiments, conductive connectors 204 may be formed on the interconnect structure 412, which may be solder bumps, conductive pillars, or the like.

The package component 401 is physically and electrically connected to the front side of an interconnect structure 422 by the conductive connectors 204. Conductive connectors 426 may be formed on the back side of the interconnect structure 422, and passive devices (not shown) may also be connected to the back side of the interconnect structure 422. An encapsulant 420 (e.g., a molding material, resin, epoxy, or the like) may surround the package component 401. An interconnect structure 424 is formed over the package component 401 and the encapsulant 420 and is electrically connected to the metal pads of the package component 401. In some embodiments, through vias 420 are formed in the encapsulant 420 that electrically connect the interconnect structure 422 to the interconnect structure 424. One or more dies 430 are connected to the interconnect structure 424 by conductive connectors 434, and an underfill may be formed between the dies 430 and the interconnect structure 424. The packages described herein are examples, and other types of packages or packages having other arrangements or configurations of features are possible.

The embodiments described herein may present advantages. By forming isolation regions in a through via region, the topology and planarity of the through via region may be improved. This allows nearby devices to be formed closer to the through via without significant reduction in yield or performance. Thus, device density may be improved. Further, forming epitaxial source/drain regions in the through via region can reduce stress in the structure from the through-substrate via, which can further improve yield and device performance. In some cases, the isolation regions and/or epitaxial source/drain regions may be formed without additional processing steps.

In an embodiment of the present disclosure, a method includes forming first nanostructures over a first region of a substrate; forming second nanostructures over a second region of the substrate; forming a first gate structure around the first nanostructures; replacing the second nanostructures with isolation regions; and forming a through via extending through isolation regions and into the substrate. In an embodiment, forming the through via includes performing an etching process to remove the isolation regions, wherein the etching process forms a recess extending into the substrate; and depositing a conductive material into the recess. In an embodiment, the method includes forming a guard ring structure encircling the through via. In an embodiment, the first gate structure is formed before replacing the second nanostructures. In an embodiment, the method includes forming first epitaxial source/drain regions adjacent the first nanostructures and second epitaxial source/drain regions adjacent the second nanostructures. In an embodiment, the through via extends through the second epitaxial source/drain regions. In an embodiment, the through via physically contacts at least one isolation region. In an embodiment, the method includes forming an interconnect structure over the first nanostructures, wherein the second region is free of the interconnect structure. In an embodiment, a distance between the through via and the second nanostructures is in the range of 0.2 μm to 2 μm.

In an embodiment of the present disclosure, a method includes forming a stack of nanostructures over a substrate; forming an epitaxial source/drain region adjacent the stack of nanostructures; forming a dummy gate structure over the stack of nanostructures; forming a first recess extending through the dummy gate structure and the stack of nanostructures, wherein the recess extends deeper than the epitaxial source/drain region; filling the first recess with a dielectric material; forming a second recess extending through the epitaxial source/drain region and the dielectric material; and filling the second recess with a conductive material. In an embodiment, forming the first recess removes the dummy gate structure and the stack of nanostructures. In an embodiment, the method includes forming dielectric layers over the dielectric material and over the epitaxial source/drain region, wherein the second recess extends through the dielectric layers. In an embodiment, the method includes forming metallization layers in the dielectric layers, wherein the metallization layers are electrically isolated from the conductive material. In an embodiment, the method includes forming a conductive line on the conductive material, wherein the conductive line extends over the metallization layers.

In an embodiment of the present disclosure, a structure includes epitaxial regions on a substrate; isolation regions extending into the substrate, wherein the isolation regions of the isolation regions are respectively sandwiched between neighboring epitaxial regions of the plurality of epitaxial regions; dielectric layers over the epitaxial regions and over the isolation regions; and a through via extending through the dielectric layers and into the substrate, wherein the through via is encircled by the epitaxial regions and the isolation regions. In an embodiment, the structure includes nanostructures on the substrate, wherein the nanostructures are separated from the through via by dummy nanostructures. In an embodiment, the nanostructures are respectively sandwiched between epitaxial regions. In an embodiment, the through via has a width in the range of 0.5 μm to 25 μm. In an embodiment, the through via physically contacts at least one isolation region. In an embodiment, the through via physically contacts at least one epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming a plurality of first nanostructures over a first region of a substrate;
- forming a plurality of second nanostructures over a second region of the substrate;
- forming a first gate structure around the plurality of first nanostructures;
- replacing the plurality of second nanostructures with a plurality of isolation regions; and
- forming a through via extending through the plurality of isolation regions and into the substrate.

2. The method of claim 1, wherein forming the through via comprises:
- performing an etching process to remove the plurality of isolation regions, wherein the etching process forms a recess extending into the substrate; and
- depositing a conductive material into the recess.

3. The method of claim 1 further comprising forming a guard ring structure encircling the through via.

4. The method of claim 1, wherein the first gate structure is formed before replacing the plurality of second nanostructures.

5. The method of claim 1 further comprising forming first epitaxial source/drain regions adjacent the first nanostructures and second epitaxial source/drain regions adjacent the second nanostructures.

6. The method of claim 5, wherein the through via extends through the second epitaxial source/drain regions.

7. The method of claim 1, wherein the through via physically contacts at least one isolation region of the plurality of isolation regions.

8. The method of claim 1 further comprising forming an interconnect structure over the first nanostructures, wherein the second region is free of the interconnect structure.

9. The method of claim 1, wherein a distance between the through via and the second nanostructures is in the range of 0.2 μm to 2 μm.

10. A method comprising:
- forming a stack of nanostructures over a substrate;
- forming an epitaxial source/drain region adjacent the stack of nanostructures;
- forming a dummy gate structure over the stack of nanostructures;
- forming a first recess extending through the dummy gate structure and the stack of nanostructures, wherein the recess extends deeper than the epitaxial source/drain region;
- filling the first recess with a dielectric material;
- forming a second recess extending through the epitaxial source/drain region and the dielectric material; and
- filling the second recess with a conductive material.

11. The method of claim 10, wherein forming the first recess removes the dummy gate structure and the stack of nanostructures.

12. The method of claim 10 further comprising forming a plurality of dielectric layers over the dielectric material and over the epitaxial source/drain region, wherein the second recess extends through the plurality of dielectric layers.

13. The method of claim 12 further comprising forming a plurality of metallization layers in the plurality of dielectric layers, wherein the plurality of metallization layers is electrically isolated from the conductive material.

14. The method of claim 13 further comprising forming a conductive line on the conductive material, wherein the conductive line extends over the plurality of metallization layers.

15. A structure comprising:
- a plurality of epitaxial regions on a substrate;
- a plurality of isolation regions extending into the substrate, wherein the isolation regions of the plurality of isolation regions are respectively sandwiched between neighboring epitaxial regions of the plurality of epitaxial regions;
- a plurality of dielectric layers over the plurality of epitaxial regions and over the plurality of isolation regions; and
- a through via extending through the plurality of dielectric layers and into the substrate, wherein the through via is encircled by the plurality of epitaxial regions and the plurality of isolation regions.

16. The structure of claim 15 further comprising a plurality of nanostructures on the substrate, wherein the plurality of nanostructures is separated from the through via by a plurality of dummy nanostructures.

17. The structure of claim 16, wherein the nanostructures of the plurality of nanostructures are respectively sandwiched between ones of the plurality of epitaxial regions.

18. The structure of claim 15, wherein the through via has a width in the range of 0.5 μm to 25 μm.

19. The structure of claim 15, wherein the through via physically contacts at least one isolation region.

20. The structure of claim 15, wherein the through via physically contacts at least one epitaxial region.

* * * * *